(12) United States Patent
Yasunaga et al.

(10) Patent No.: US 9,653,377 B2
(45) Date of Patent: May 16, 2017

(54) SEMICONDUCTOR DEVICE

(71) Applicant: ROHM CO., LTD., Kyoto-shi, Kyoto (JP)

(72) Inventors: Shoji Yasunaga, Kyoto (JP); Akihiro Koga, Kyoto (JP)

(73) Assignee: ROHM CO., LTD., Kyoto (JP)

( * ) Notice: Subject to any disclaimer, the term of this patent is extended or adjusted under 35 U.S.C. 154(b) by 0 days.

(21) Appl. No.: 15/184,560

(22) Filed: Jun. 16, 2016

(65) Prior Publication Data
US 2016/0300776 A1   Oct. 13, 2016

Related U.S. Application Data

(63) Continuation of application No. 14/220,383, filed on Mar. 20, 2014, now Pat. No. 9,397,037.

(30) Foreign Application Priority Data

| Mar. 21, 2013 | (JP) | 2013-058545 |
| Mar. 21, 2013 | (JP) | 2013-058546 |
| Mar. 21, 2013 | (JP) | 2013-058547 |
| Mar. 21, 2013 | (JP) | 2013-058548 |
| Mar. 21, 2013 | (JP) | 2013-058549 |
| Jan. 24, 2014 | (JP) | 2014-011051 |

(51) Int. Cl.
*H01L 23/34* (2006.01)
*H01L 23/373* (2006.01)
(Continued)

(52) U.S. Cl.
CPC ...... *H01L 23/3731* (2013.01); *H01L 23/3142* (2013.01); *H01L 23/367* (2013.01); *H01L 23/4334* (2013.01); *H01L 23/49503* (2013.01); *H01L 23/49548* (2013.01); *H01L 23/49555* (2013.01); *H01L 23/49568* (2013.01); *H01L 23/49575* (2013.01); *H01L 23/52* (2013.01); *H01L 24/32* (2013.01); *H01L 24/48* (2013.01); *H01L 24/85* (2013.01); *H01L 23/3107* (2013.01); *H01L 24/06* (2013.01);
(Continued)

(58) Field of Classification Search
CPC ............ H01L 23/3731; H01L 23/3142; H01L 23/367; H01L 23/49575; H01L 23/49568
USPC ........................................ 257/720
See application file for complete search history.

(56) References Cited

U.S. PATENT DOCUMENTS 5,442,234 A * 8/1995 Liang .................. H01L 23/4334
257/675
5,559,374 A   9/1996 Ohta et al.
(Continued)

FOREIGN PATENT DOCUMENTS

JP   2011-243839   12/2011

*Primary Examiner* — Luan C Thai
(74) *Attorney, Agent, or Firm* — Hamre, Schumann, Mueller & Larson, P.C.

(57) ABSTRACT

A semiconductor device includes two or more semiconductor elements, a lead with island portions on which the semiconductor elements are mounted, a heat dissipation member for dissipating heat from the island portions, a bonding layer bonding the island portions and the heat dissipation member, and a sealing resin covering the semiconductor elements, the island portions and a part of the heat dissipation member. The bonding layer includes mutually spaced individual regions provided for the island portions, respectively.

20 Claims, 24 Drawing Sheets

(51) Int. Cl.
*H01L 23/52* (2006.01)
*H01L 23/00* (2006.01)
*H01L 23/433* (2006.01)
*H01L 23/495* (2006.01)
*H01L 23/367* (2006.01)
*H01L 23/31* (2006.01)

(52) U.S. Cl.
CPC ............ *H01L 24/29* (2013.01); *H01L 24/45* (2013.01); *H01L 24/49* (2013.01); *H01L 24/73* (2013.01); *H01L 24/78* (2013.01); *H01L 2224/04042* (2013.01); *H01L 2224/0603* (2013.01); *H01L 2224/27013* (2013.01); *H01L 2224/29101* (2013.01); *H01L 2224/29339* (2013.01); *H01L 2224/32245* (2013.01); *H01L 2224/45015* (2013.01); *H01L 2224/45124* (2013.01); *H01L 2224/45144* (2013.01); *H01L 2224/48091* (2013.01); *H01L 2224/48137* (2013.01); *H01L 2224/48139* (2013.01); *H01L 2224/48195* (2013.01); *H01L 2224/48247* (2013.01); *H01L 2224/48465* (2013.01); *H01L 2224/48472* (2013.01); *H01L 2224/48997* (2013.01); *H01L 2224/4903* (2013.01); *H01L 2224/49171* (2013.01); *H01L 2224/49505* (2013.01); *H01L 2224/73265* (2013.01); *H01L 2224/78301* (2013.01); *H01L 2224/83385* (2013.01); *H01L 2224/85045* (2013.01); *H01L 2224/85181* (2013.01); *H01L 2224/85951* (2013.01); *H01L 2924/12042* (2013.01); *H01L 2924/1305* (2013.01); *H01L 2924/1306* (2013.01); *H01L 2924/13055* (2013.01); *H01L 2924/13091* (2013.01); *H01L 2924/181* (2013.01); *H01L 2924/1815* (2013.01); *H01L 2924/18301* (2013.01); *H01L 2924/19041* (2013.01); *H01L 2924/19042* (2013.01); *H01L 2924/19043* (2013.01); *H01L 2924/19105* (2013.01); *H01L 2924/351* (2013.01)

(56) References Cited

U.S. PATENT DOCUMENTS

| | | | |
|---|---|---|---|
| 6,979,843 | B2 | 12/2005 | Nakajima et al. |
| 6,979,909 | B2 | 12/2005 | Shinohara |
| 7,319,266 | B2 | 1/2008 | St. Germain et al. |
| 7,635,613 | B2* | 12/2009 | Lange ............... H01L 21/565 257/675 |
| 7,687,902 | B2 | 3/2010 | Shiraishi et al. |
| 8,039,934 | B2* | 10/2011 | Kasuya ............ H01L 23/49503 257/672 |
| 9,093,434 | B2 | 7/2015 | Kimura |
| 2002/0117740 | A1 | 8/2002 | Jang et al. |
| 2005/0263861 | A1 | 12/2005 | Ahn et al. |
| 2006/0056213 | A1 | 3/2006 | Lee et al. |

* cited by examiner

FIG.27
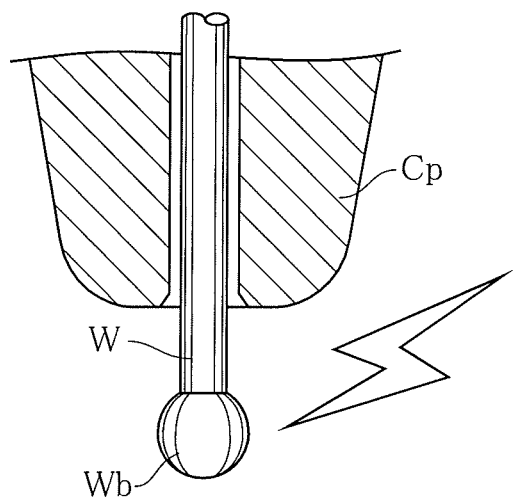
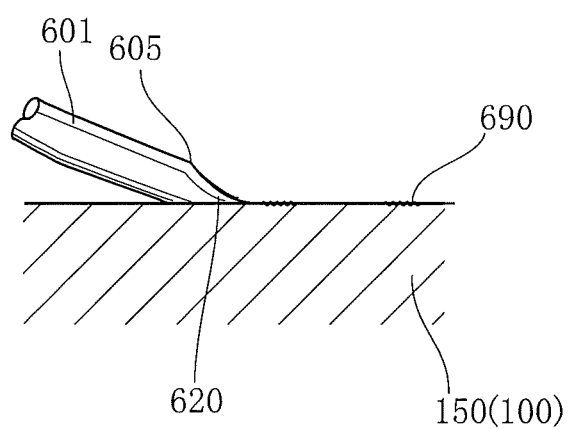

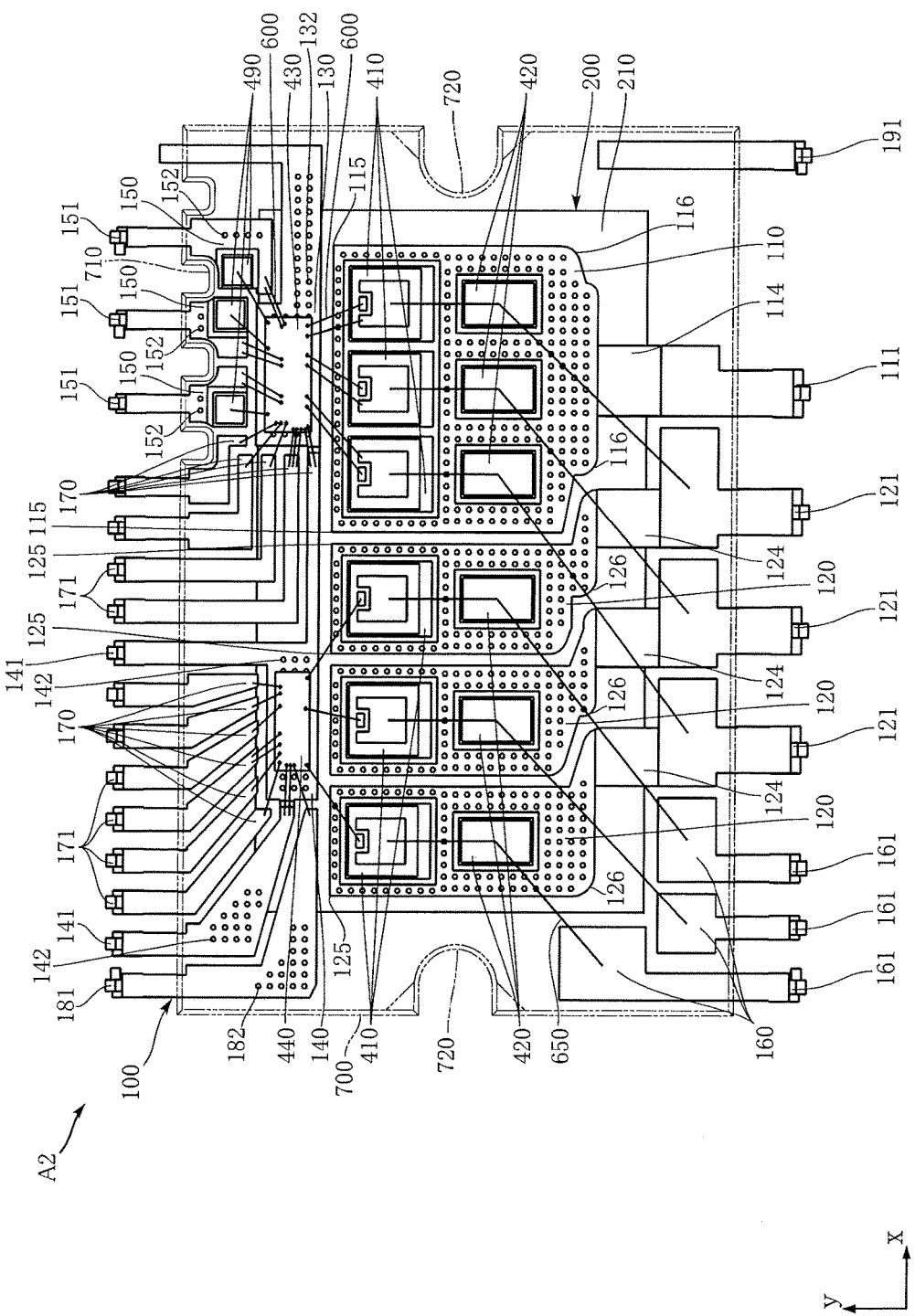

SEMICONDUCTOR DEVICE

BACKGROUND OF THE INVENTION

1. Field of the Invention

The present invention relates to a semiconductor device.

2. Description of the Related Art

Various semiconductor devices are conventionally known. One of the known semiconductor devices is an IPM (Intelligent Power Module). A semiconductor device of this type includes a plurality of semiconductor elements, a lead including a plurality of island portions, a heat dissipation member and a sealing resin. The semiconductor elements are mounted on the island portions, respectively. The island portions are bonded to the heat dissipation member. The sealing resin covers the semiconductor elements, the island portions and the heat dissipation member. The semiconductor elements are electrically connected to each other appropriately via wires, so are the semiconductor elements and the lead. An example of the IPM is disclosed in JP-A-2011-243839.

In a semiconductor device configured as an IPM, the semiconductor element heats up during use. Due to the heat, the lead, the heat dissipation member and the sealing resin are thermally expanded. Generally, the lead, the heat dissipation member and the sealing resin are made of different materials. Thus, thermal stress is generated at the portions where these members are bonded to each other. When e.g. the lead and the sealing resin partially separate from each other due to thermal stress, proper insulation may not be provided between the semiconductor elements or between the semiconductor elements and the lead.

Since the heat dissipation member is provided for dissipating the heat generated at the semiconductor element to the outside, part of the heat dissipation member is exposed from the sealing resin. Thus, the edge of the interface between the heat dissipation member and the sealing resin is exposed to the outside. Depending on use environment of the semiconductor device, moisture and so on may enter the interface. When moisture enters deep into the device, the heat dissipation member and the sealing resin may separate from each other, which may lead to corrosion of e.g. the semiconductor element.

In a semiconductor device configured as IPM, thermal stress is applied also on the wires bonded to the semiconductor elements or the lead. Since each wire has a relatively discontinuous shape at the bonding portion, stress tends to be intensively applied on the bonding portion. Due to such intensive stress application, the wire may be detached from the semiconductor element or the lead.

Thermal stress is applied also on the portion where the semiconductor element and the island portion are bonded to each other. The semiconductor element is bonded to the island portion with a bonding material such as solder or Ag paste. When the bonding strength of the semiconductor element and the island portion with the bonding material is insufficient, the semiconductor element may be detached from the island portion.

Generally, the lead is made of a metal. Thus, the portion where the lead and the sealing resin are bonded together is the portion where different materials, i.e., metal and resin are bonded together. Since the coefficient of thermal expansion is considerably different between metal and resin, thermal stress is likely to occur. When the lead and the sealing resin become detached from each other due to thermal stress, proper insulation cannot be provided.

SUMMARY OF THE INVENTION

The present invention has been conceived under the circumstances described above. It is therefore an object of the present invention to provide a semiconductor device capable of preventing detachment of the sealing resin. Another object of the present invention is to provide a semiconductor device capable of preventing detachment of wires. Another object of the present invention is to provide a semiconductor device capable of preventing detachment of the semiconductor elements and the island portions. Another object of the present invention is to provide a semiconductor device capable of preventing detachment of the lead and the sealing resin.

According to an embodiment of the present invention, there is provided a semiconductor device including: semiconductor elements; a lead including island portions on which the semiconductor elements are mounted; a heat dissipation member for dissipating heat from the island portions; a bonding layer bonding the heat dissipation member to the island portions; and a sealing resin covering the semiconductor elements, the island portions and a part of the heat dissipation member. The bonding layer includes individual regions provided for the island portions, respectively. The individual regions are spaced apart from each other.

Preferably, each of the individual regions has an outer edge positioned inward of an outer edge of a corresponding one of the island portions.

Preferably, the heat dissipation member is made of a ceramic material.

Preferably, the heat dissipation member includes an exposed surface that is exposed from the sealing resin and flush with an surface of the sealing resin.

Preferably, the heat dissipation member is in a form of a plate.

Preferably, the semiconductor elements include at lease one power semiconductor element.

Preferably, at least two of the semiconductor elements are mounted on one of the island portions.

Preferably, the island portions are aligned in a direction.

Preferably, the semiconductor device of an embodiment of the present invention further includes terminal portions connected to the island portions, respectively, where the terminal portions are exposed from the sealing resin.

Preferably, each of the island portions is formed with recesses, which may be arranged in a predetermined pattern. In an embodiment, each of the recesses is circular in cross section. In each of the island portions, the recesses may be arranged to surround the semiconductor element mounted on the island portion.

Preferably, each of the island portions has a smooth surface for mounting a semiconductor element.

Preferably, the semiconductor device of an embodiment of the present invention further includes a bonding material for bonding the island portions to the bottom surfaces of the respective semiconductor elements. Preferably, the bottom surfaces of the respective semiconductor elements have a higher wettability to the bonding material in a molten state than the island portions.

Preferably, each of the semiconductor elements includes a bottom-surface electrode that provides the bottom surface of each semiconductor element.

Preferably, each of the semiconductor elements includes a semiconductor main body, and the bottom-surface electrode entirely covers the bottom surface of the semiconductor main body.

Preferably, each of the island portions includes a trench disposed on an outer side of the semiconductor element mounted.

Preferably, in each of the island portions, the bonding material is disposed inward of the trench.

Preferably, in each of the island portions, the trench surrounds the semiconductor element mounted.

Preferably, in each of the island portions, the recesses are provided on an outer side of the trench.

Other features and advantages of the present invention will become more apparent from detailed description given below with reference to the accompanying drawings.

BRIEF DESCRIPTION OF THE DRAWINGS

FIG. 27 is a schematic sectional view illustrating a process of making a wire of the semiconductor device of FIG. 1;

FIG. 30 is a plan view illustrating a semiconductor device according to a second embodiment of the present invention.

DESCRIPTION OF THE PREFERRED EMBODIMENTS

Figure 1:
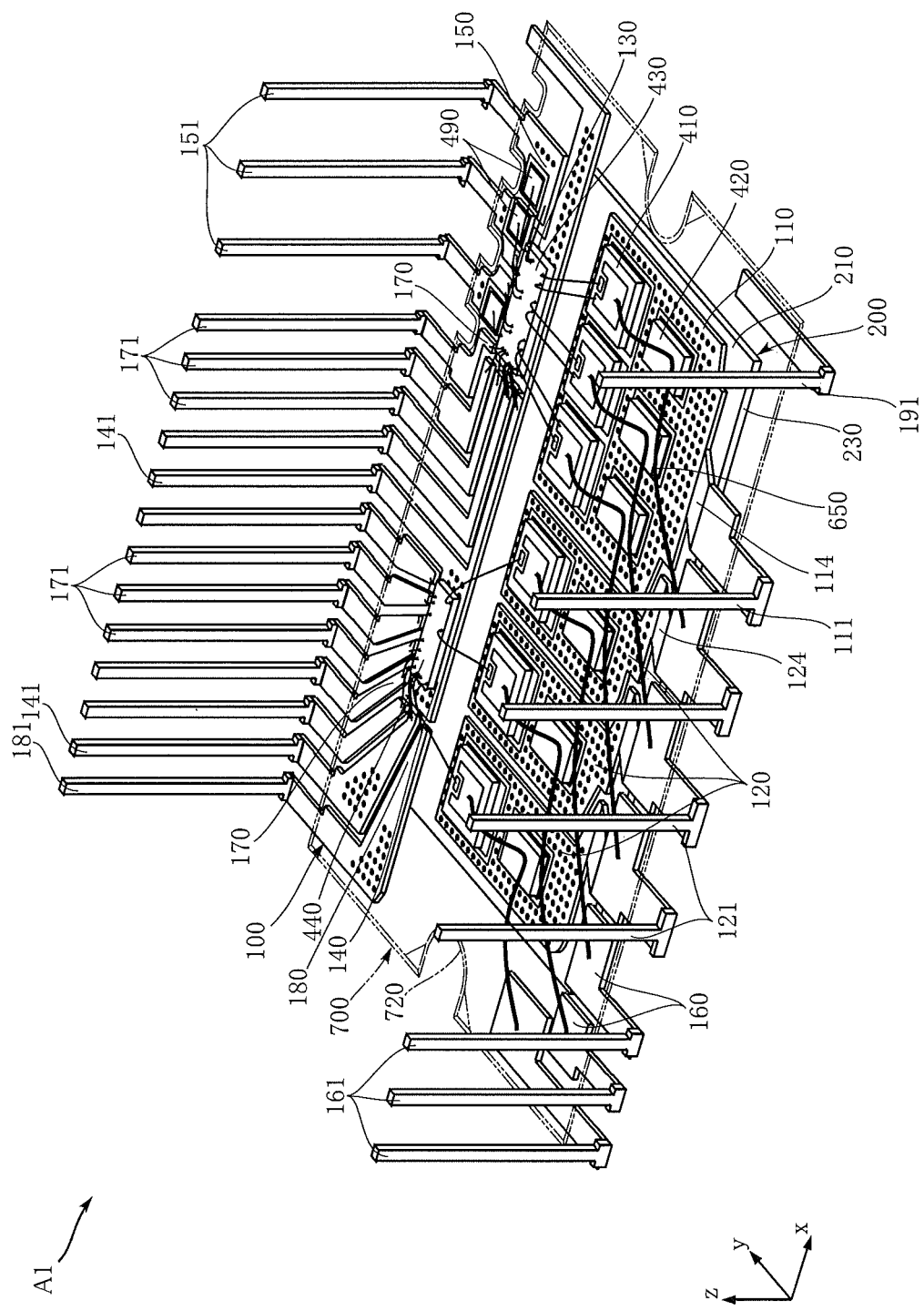
FIG. 1 is a perspective view illustrating a semiconductor device according to a first embodiment of the present invention.

Preferred embodiments of the present invention are described below with reference to the accompanying drawings.

FIGS. 1-7 illustrate a semiconductor device according to a first embodiment of the present invention. The semiconductor device A1 of this embodiment includes a lead 100, a heat dissipation member 200, a bonding layer 300, a plurality of semiconductor elements 410, 420, 430, 440, a plurality of passive components 490, bonding materials 510, 520, wires 600, 650 and a sealing resin 700. For instance, the semiconductor device A1 is structured as an IPM for drive control of e.g. an inverter motor. For instance, the semiconductor device A1 is about 38 mm in the dimension in the direction x, about 24 mm in the dimension in the direction y and about 3.5 mm in the dimension in the direction z (thickness of the sealing resin 700).

Figure 2:
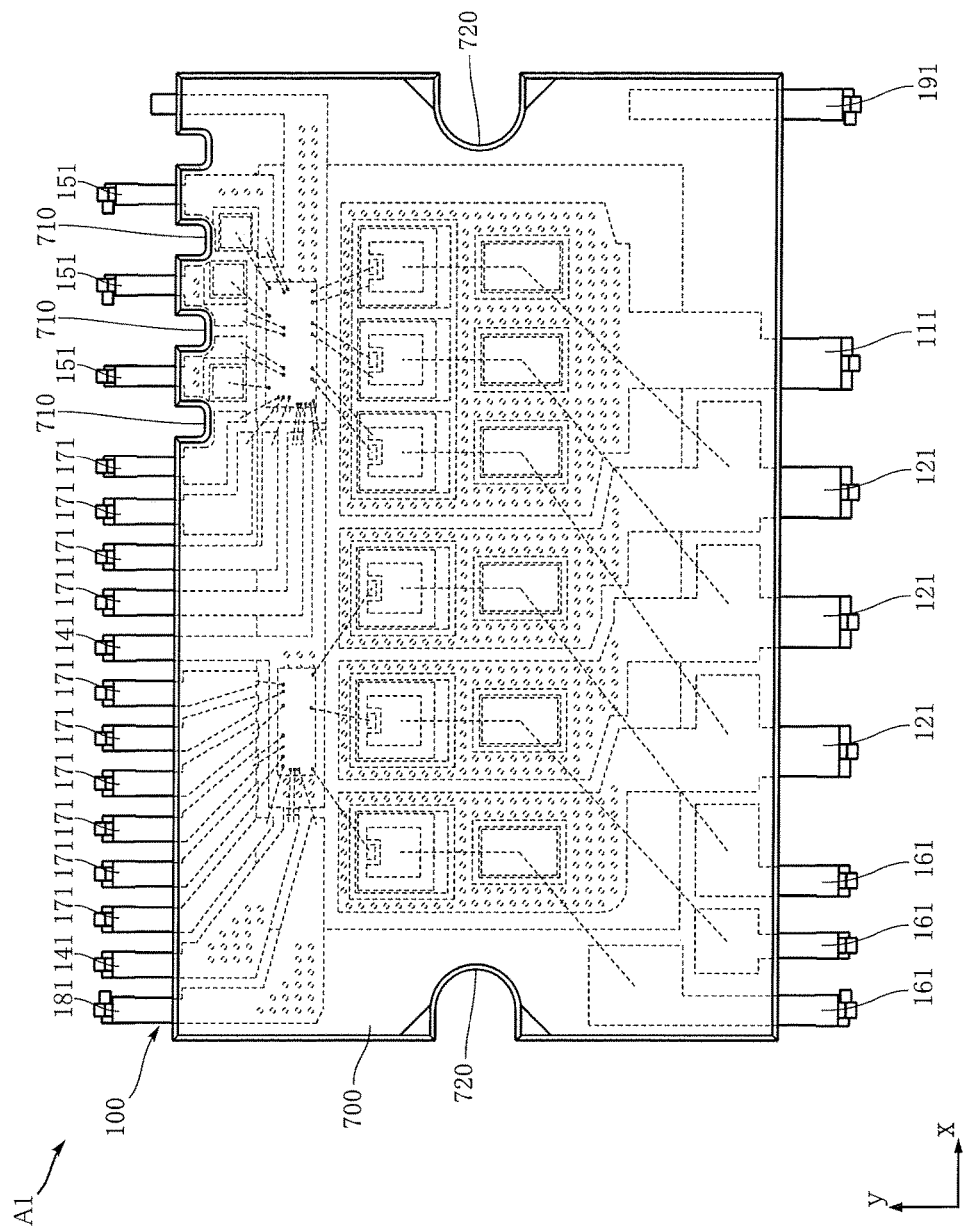
FIG. 2 is a plan view of the semiconductor device of FIG. 1.
Figure 3:
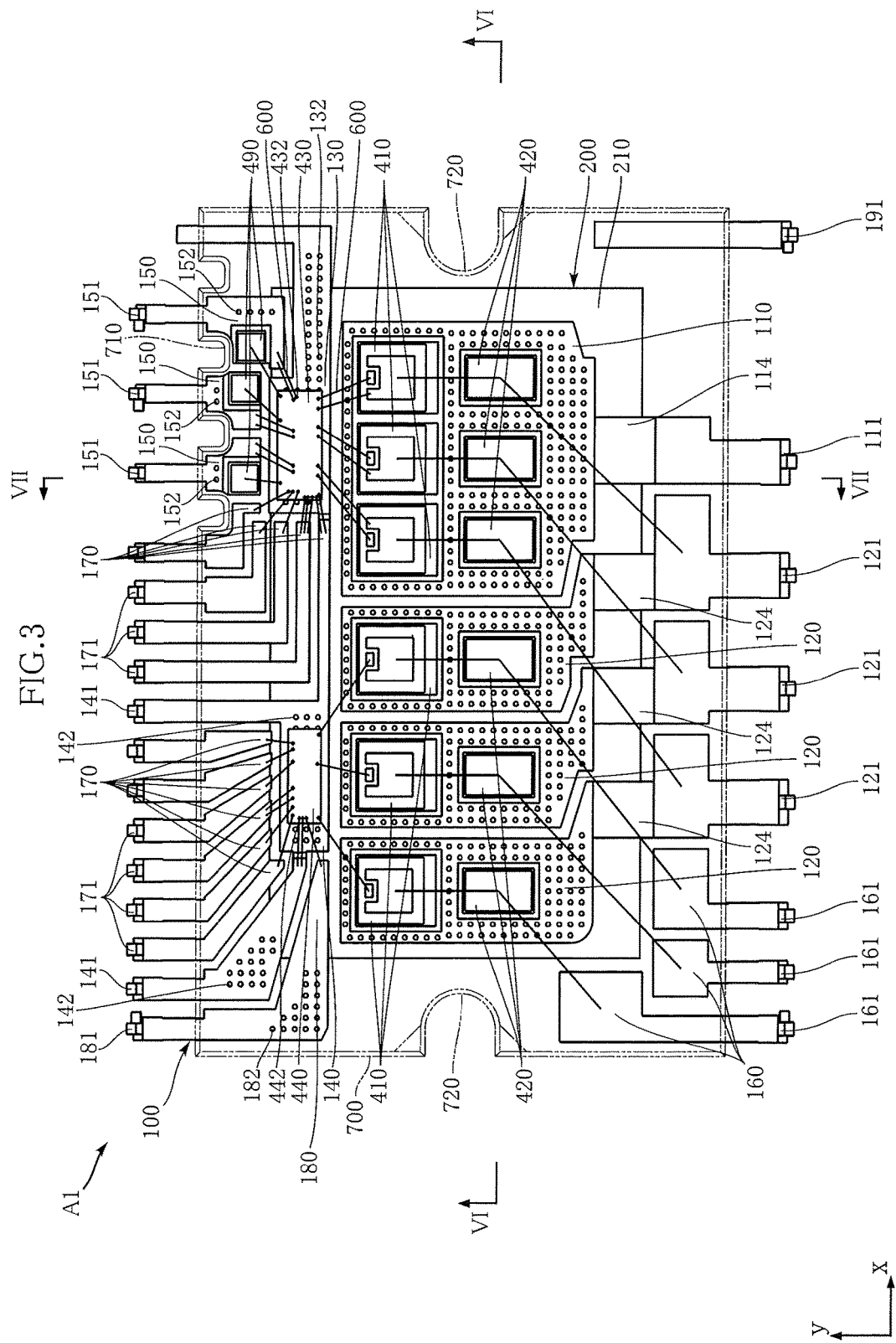
FIG. 3 is a plan view of the semiconductor device of FIG. 1.
Figure 4:
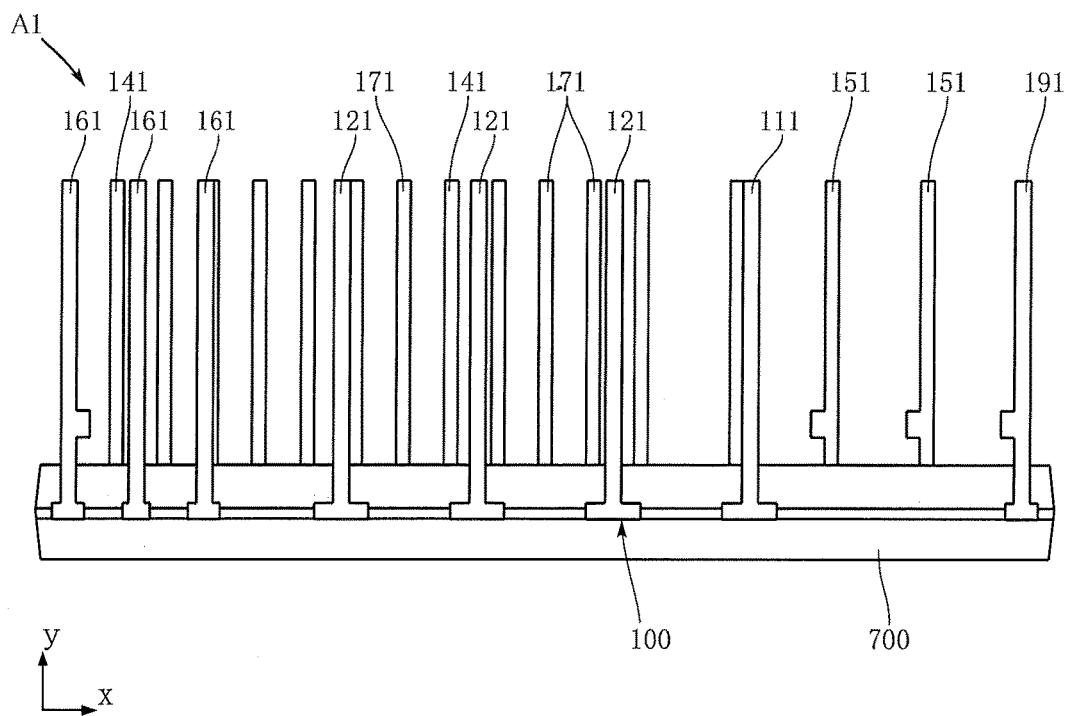
FIG. 4 is a front view of the semiconductor device of FIG. 1.
Figure 5:
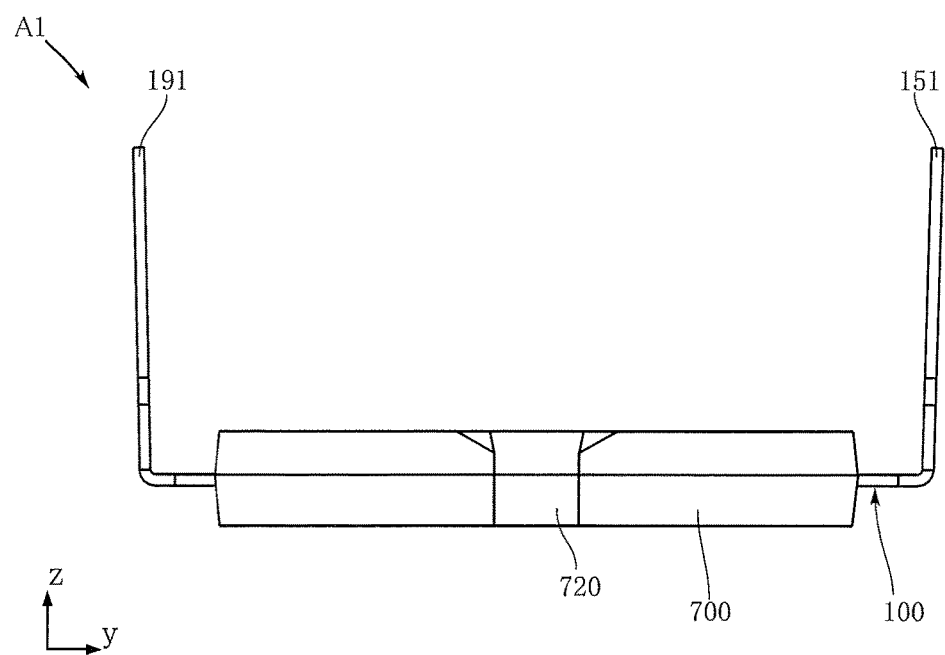
FIG. 5 is a side view of the semiconductor device of FIG. 1.
Figure 6:
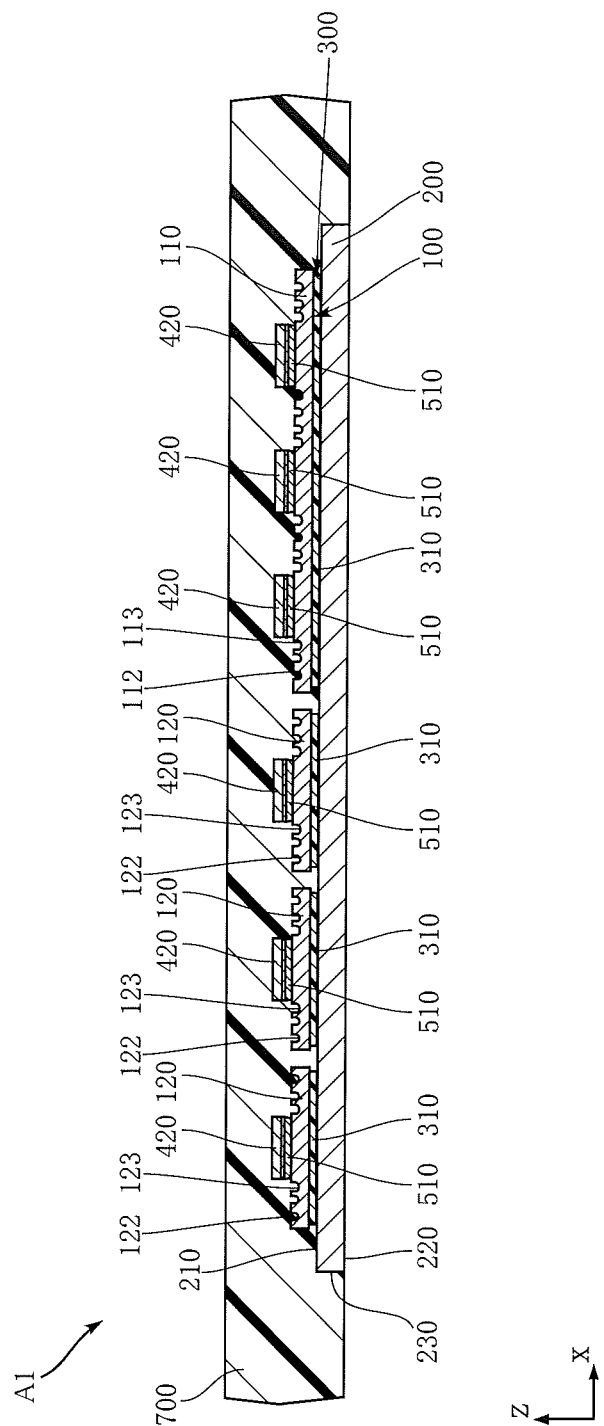
FIG. 6 is a schematic sectional view taken along lines VI-VI in FIG. 3.
Figure 7:
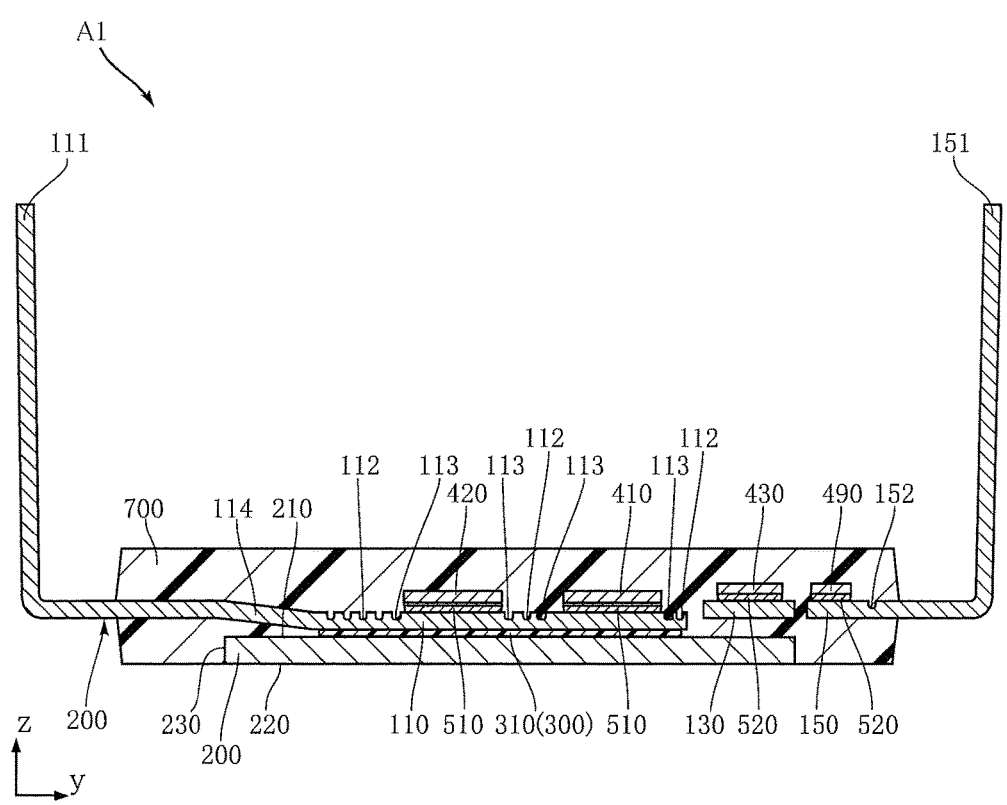
FIG. 7 is a schematic sectional view taken along lines VII-VII in FIG. 3.

FIG. 1 is a perspective view of the semiconductor device A1. For easier understanding, with respect to the sealing resin 700, only the main outer line is indicated by double-dashed lines. FIG. 2 is a plan view of the semiconductor device A1. FIG. 3 is a plan view of the semiconductor device A1, in which the sealing resin 700 is indicated by double-dashed lines for easier understanding. FIG. 4 is a front view of the semiconductor device A1. FIG. 5 is a side view of the semiconductor device A1. FIG. 6 is a sectional view in the z-x plane taken along lines VI-VI in FIG. 3, in which terminal portions are omitted for easier understanding. FIG. 7 is a sectional view in the y-z plane taken along lines VII-VII in FIG. 3. In the sectional views referred to below, illustration of wires 600 and wires 650 is omitted for easier understanding.

The lead 100 is an electrically conductive supporting means that supports the semiconductor elements 410, 420, 430, 440 and provides an electrical conduction path to the semiconductor elements. In this embodiment, the lead 100 includes island portions 110, 120, 130, 140, 150, pad portions 160, 170, 180 and terminal portions 111, 121, 141, 151,

161, 171, 181, 191. The lead 100 is made of a metal and in this embodiment made of Cu. The thickness of the lead 100 is e.g. about 0.42 mm. The lead 100 may be formed by punching, cutting or bending a metal plate.

The island portions 110, 120, 130, 140, 150 are the portions on which the semiconductor elements 410, 420, 430, 440 and the passive components 490 are mounted. In this embodiment, the single island portion 110 and the island portions 120 (three portions in the illustrated example) are aligned in the direction x. The island portion 130 and the island portion 140 are aligned in the direction x. The island portions 110, 120 and the island portions 130, 140 are aligned in the direction y. The island portions 150 (three portions in the illustrated example) are adjacent to the island portion 130 in the direction y.

Figure 8:
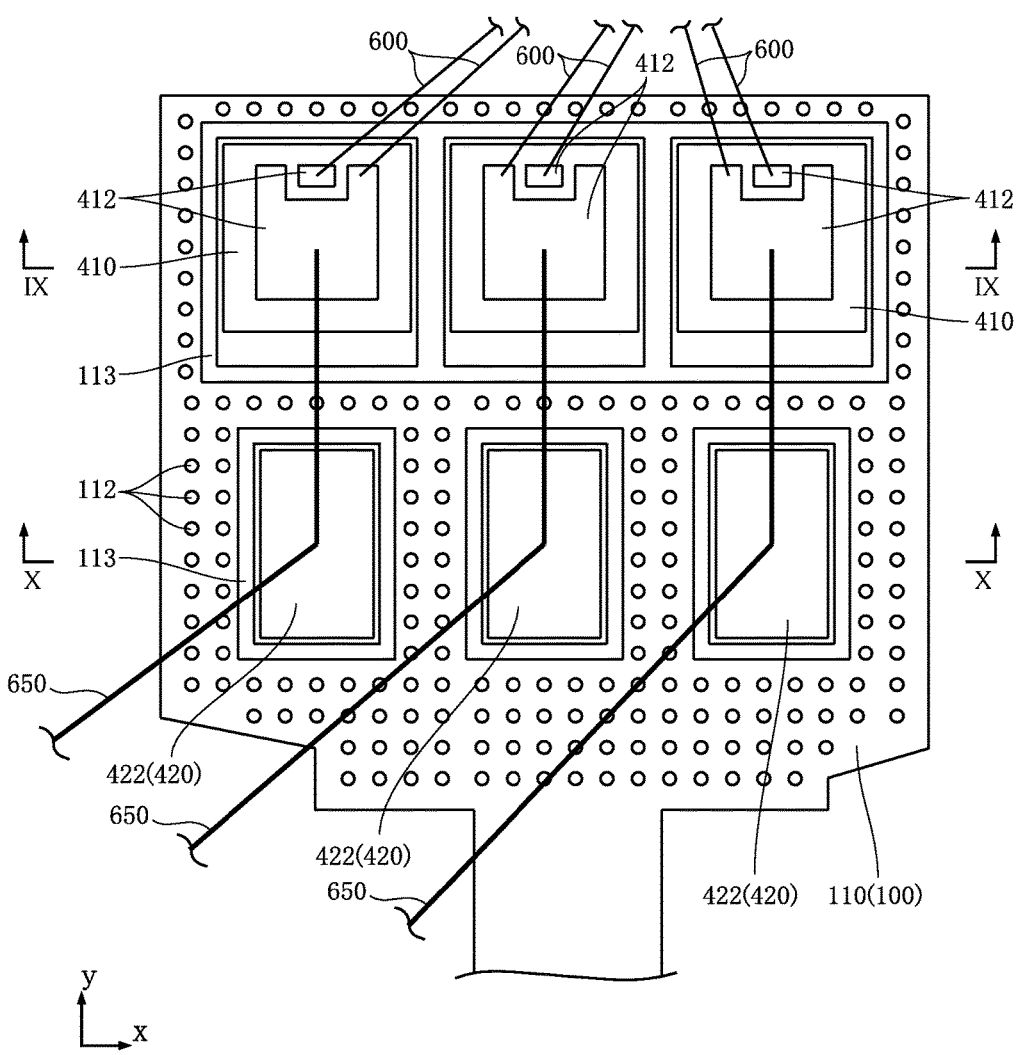
FIG. 8 is a schematic plan view of island portions of the semiconductor device of FIG. 1.
Figure 9:
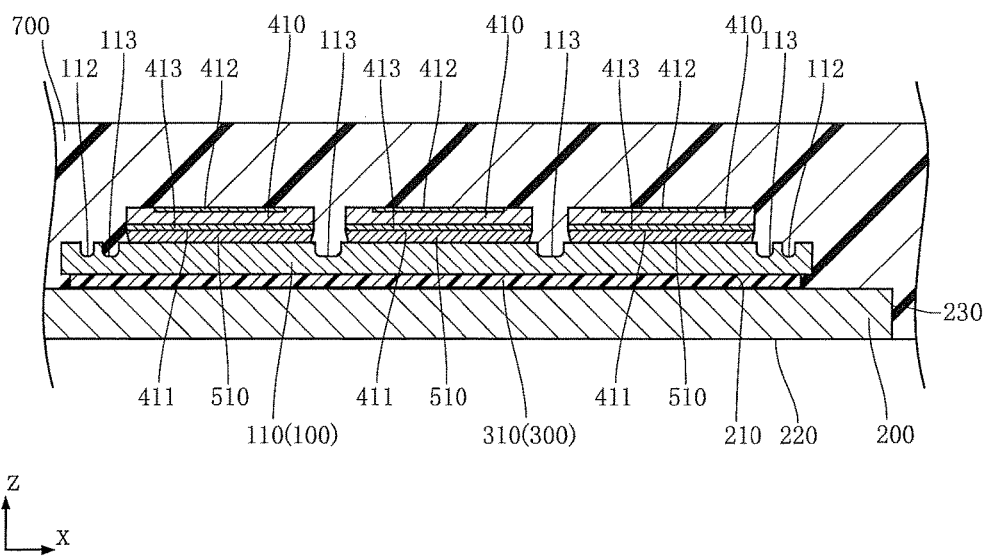
FIG. 9 is a schematic sectional view taken along lines IX-IX in FIG. 8.
Figure 10:
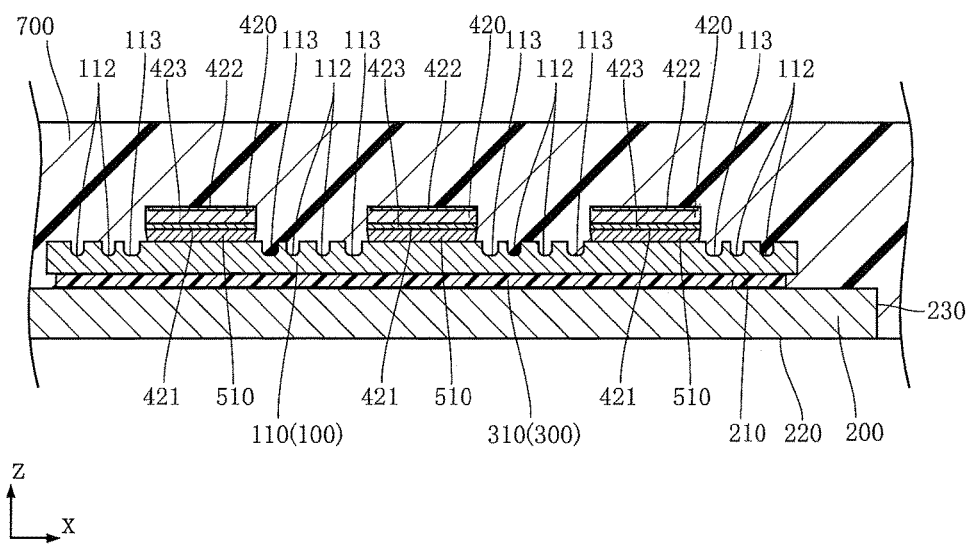
FIG. 10 is a schematic sectional view taken along lines X-X in FIG. 8.

FIG. 8 is a schematic plan view illustrating the island portion 110 and the related portions. FIG. 9 is a schematic sectional view in the z-x plane taken along lines IX-IX in FIG. 8. FIG. 10 is a schematic sectional view in the z-x plane taken along lines X-X in FIG. 8. The island portion 110 is generally rectangular. The semiconductor elements 410 and 420 are mounted on the island portion 110. Specifically, in this embodiment, three semiconductor elements 410 and three semiconductor elements 420 are mounted on the island portions 110. The three semiconductor elements 410 are aligned in the direction x, so are the three semiconductor elements 420. The semiconductor elements 410 are spaced apart from the semiconductor elements 420, respectively, in the direction y such that each semiconductor element 410 overlaps solely a corresponding one of the semiconductor elements 420 as viewed in the direction y.

The island portion 110 is formed with a plurality of recesses 112 and a plurality of trenches 113. The recesses 112 open in the surface of the island portion 110 on which the semiconductor elements 410 and 420 are mounted. In this embodiment, the recesses 112 are circular in cross section. However, the shape of the recesses 112 in the present invention is not limited to this. The recesses 112 are provided on the island portion 110 at portions avoiding the trenches 113 or avoiding the regions surrounded by the trenches 113. In this embodiment, the recesses 112 are arranged in a matrix along the direction x and the direction y.

The trenches 113 are formed so as to surround the semiconductor elements 410 or the semiconductor elements 420. The trenches 113 open in the surface of the island portion 110 on which the semiconductor elements 410 and 420 are mounted. The trench 113 on the upper side in FIG. 8 includes a rectangular frame portion and two strip portions elongated in the direction y and dividing the frame portion into three parts. Thus, the trench 113 on the upper side in FIG. 8 surrounds three regions in which the semiconductor elements 410 are arranged, respectively. Each of the three trenches 113 on the lower side in FIG. 8 is in the form of a rectangular frame. Each of these trenches 113 surrounds a region on which one of the semiconductor elements 420 is mounted. Although it is preferable that each trench has a closed shape that surrounds the semiconductor element entirely, the present invention is not limited to this. For instance, the trench may be made up of a plurality of separate portions arranged around the semiconductor element.

Figure 16:
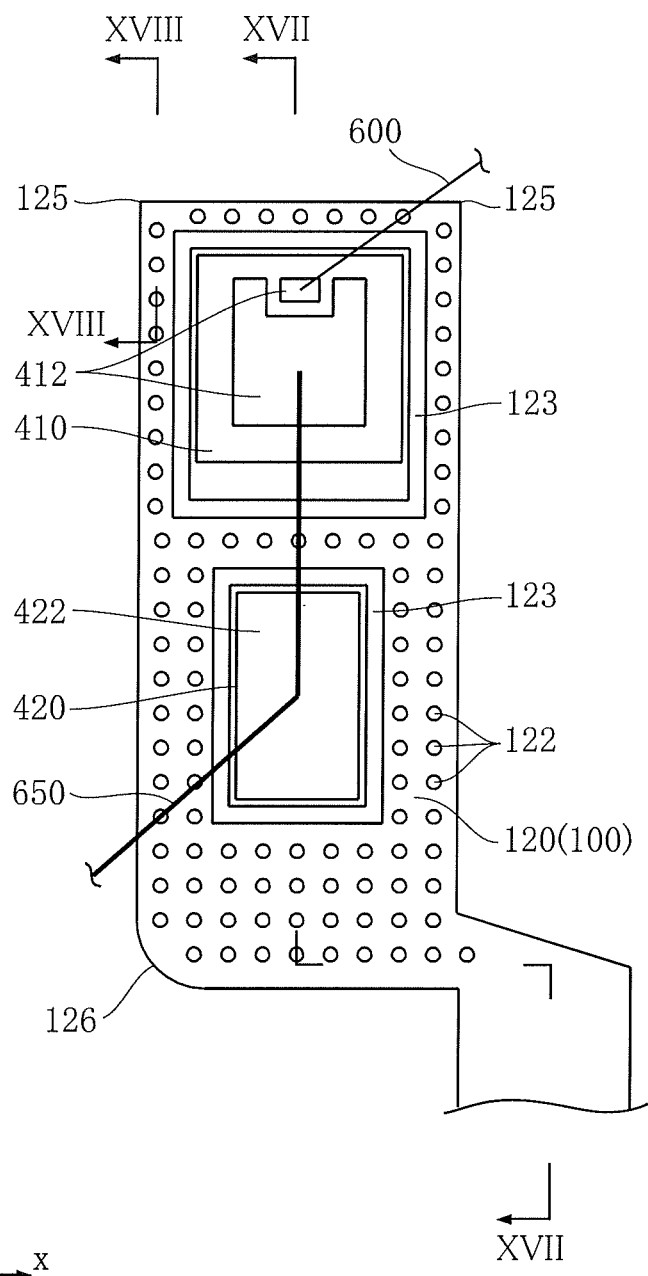
FIG. 16 is a schematic plan view illustrating an island portion of the semiconductor device shown in FIG. 1.
Figure 17:
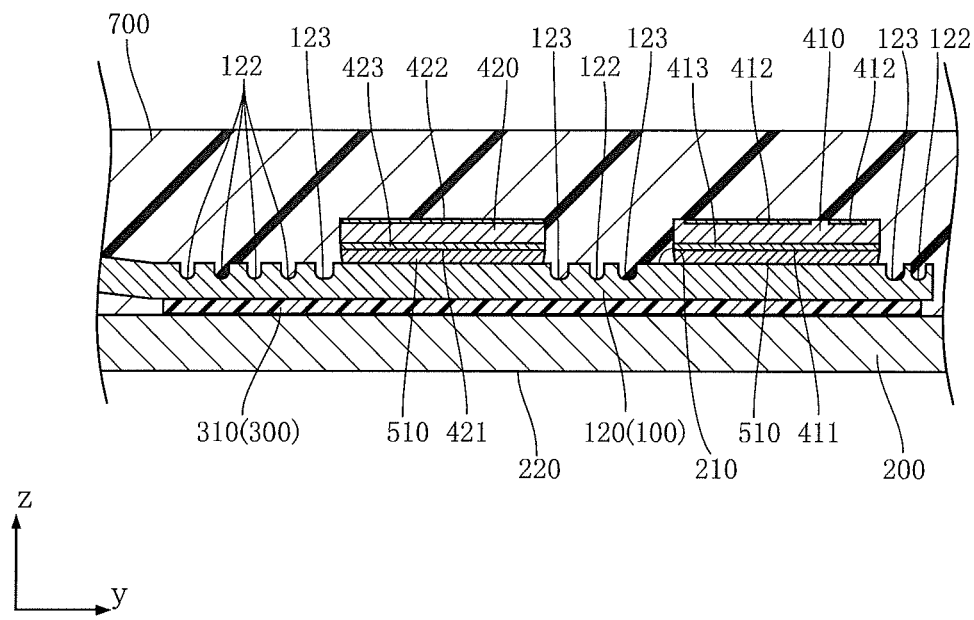
FIG. 17 is a schematic enlarged sectional view taken along lines XVII-XVII in FIG. 16.

FIG. 16 is a schematic plan view illustrating the island portion 120 located at the left end in FIG. 3 and the related portions. The structures of other island portions 120 shown in FIG. 3 are basically the same as the structure of this island portion 120 except some differences in shape. FIG. 17 is a schematic sectional view in the y-z plane taken along lines XVII-XVII in FIG. 16. The island portion 120 is generally in the form of a rectangle elongated in the direction y. The semiconductor elements 410 and 420 are mounted on the island portion 120. Specifically, in this embodiment, one of the semiconductor elements 410 and one of the semiconductor elements 420 are mounted on the island portion 120. The semiconductor element 410 and the semiconductor element 420 are aligned in the direction y.

The island portion 120 is formed with a plurality of recesses 122 and a plurality of trenches 123. The recesses 122 open in the surface of the island portion 120 on which the semiconductor elements 410 and 420 are mounted. In this embodiment, the recesses 112 are circular in cross section. However, the shape of the recesses 112 in the present invention is not limited to this. The recesses 122 are provided on the island portion 110 at portions avoiding the trenches 123 or avoiding the regions surrounded by the trenches 123. In this embodiment, the recesses 122 are arranged in a matrix along the direction x and the direction y.

The trenches 123 are formed so as to surround the semiconductor element 410 or the semiconductor element 420. The trendies 123 open in the surface of the island portion 120 on which the semiconductor elements 410 and 420 are mounted. The upper trench 123 in FIG. 16 is in the form of a rectangular frame. In the region surrounded by this trench 123 is arranged the semiconductor element 410. The lower trench 123 in FIG. 16 is also in the form of a rectangular frame. In the region surrounded by this trench 123 is arranged the semiconductor element 420. Although it is preferable that each trench has a closed shape that surrounds the semiconductor element entirely, the present invention is not limited to this. For instance, the trench may be made up of a plurality of separate portions arranged around the semiconductor element.

The island portion 120 shown in FIG. 16 is formed with two corners 125 and an arcuate portion 126. The two corners 125 are provided on the upper end in FIG. 16 (on the side farther from the terminal portion 121, which is described later), whereas the arcuate portion 126 is provided on the lower end in FIG. 16 (on the side closer to the terminal portion 121). In FIG. 16, the corners 125 are on the upper side of the semiconductor elements 410, 420 (on the side farther from terminal portion 121), whereas the arcuate portion 126 is on the lower side of the semiconductor elements 410, 420 (on the side closer to the terminal portion 121). In this embodiment, at each of the corners 125, two sides of the island portion 120 are connected to each other to form an angle of 90°. At the arcuate portion 126, two sides of the island portion 120 are connected to each other to form an arc.

As shown in FIGS. 1-3 and FIG. 7, the island portion 130 is adjacent to the island portion 110 in the direction y. The island portion 130 is generally in the form of a rectangle elongated in the direction x. The semiconductor element 430 is mounted on the island portion 130. The semiconductor element 430 is in the form of a rectangle elongated in the direction x, similarly to the island portion 130.

The island portion 130 is formed with a plurality of recesses 132. The recesses 132 open in the surface of the island portion 130 on which the semiconductor element 4'30 is mounted. In this embodiment, the recesses 132 are circular in cross section. However, the shape of the recesses 132 in the present invention is not limited to this. The recesses 132 are provided on the island portion 130 mainly at portions avoiding the semiconductor element 430. The recesses 132 may be provided in the region overlapping the semiconductor element 430 as long as detachment of the semiconductor element 430 is not caused. In this embodiment, the recesses 132 are arranged in a matrix along the direction x and the direction y.

The island portion 140 is adjacent to the island portions 120 in the direction y. The island portion 140 is generally in the form of a rectangle elongated in the direction x. The semiconductor element 440 is mounted on the island portion 120. The semiconductor element 440 is also in the form of a rectangle elongated in the direction x.

The island portion 140 is formed with a plurality of recesses 142. The recesses 142 open in the surface of the island portion 140 on which the semiconductor element 440 is mounted. In this embodiment, the recesses 142 are circular in cross section. However, the shape of the recesses 142 in the present invention is not limited to this. The recesses 142 are provided on the island portion 140 mainly at portions avoiding the semiconductor element 440. The recesses 142 may be provided in the region overlapping the semiconductor element 440 as long as detachment of the semiconductor element 440 is not caused. In this embodiment, the recesses 142 are arranged in a matrix along the direction x and the direction y. The recesses 142 are formed also in the generally triangular portion connected to the island portion 140.

The three island portions 150 are adjacent to the island portion 130 in the direction y. The three island portions 150 are aligned in the direction x. Each of the island portions 150 is configured to be smaller than the island portions 110, 120, 130, 140. On each island portion 150 is mounted a passive component 490. Each island portion 150 is formed with a plurality of recesses 152. The recesses 152 open in the surface of the island portion 150 on which the passive component 490 is mounted. The recesses 152 are provided at portions avoiding the passive component 490. In this embodiment, the recesses 152 are arranged in a matrix along the direction x and the direction y. Each island portion 150 is formed with an arcuate cutout corresponding to a groove 710 of the sealing resin 700, which is described later.

The pad portions 160, 170, 180 are electrically connected to the semiconductor elements 410, 420, 430, 440 via wires 600, 650.

The pad portions 160 are provided on the lower left of the island portions 120 in FIG. 3. Each of the pad portions 160 is rectangular. A wire 650 is bonded to each pad portion 160.

The pad portions 170 are arranged adjacent to the island portions 130, 140. Each pad portion 170 is generally in the form of a thin elongated rectangle and comprises an end of a thin strip portion. A wire 600 is bonded to each pad portion 170.

The pad portion 180 is on the left end in FIG. 3. A wire 600 is bonded to the pad portion 180. The pad portion 180 is generally triangular and formed with a plurality of recesses 182. The recesses 182 open in the surface of the island portion 180 on which the wire 600 is bonded. The recesses 182 are provided at portions avoiding the wire 600. In this embodiment, the recesses 182 are arranged in a matrix along the direction x and the direction y.

For instance, the above-described recesses 112, 122, 132, 142, 152, 182 and the trenches 113, 123 may be formed by e.g. etching in the process of making the lead 100. Alternatively, the recesses and trenches may be formed by using a die having a plurality of projections for the cutting work or bending work for making the lead 100.

As understood from FIGS. 1, 3 and 7, the lead 100 includes bent portions 114 and 124. The bent portion 114 is connected to the island portion 110 and bent in such a manner that the side farther away from the island portions 110 is at a higher position in the direction z. The bent portions 124 are connected to the island portions 120. Each bent portion 124 is bent in such a manner that the side farther away from the island portion 120 is at a higher position in the direction z.

In this embodiment, the portions of the bent portions 114, 124 which are higher in the direction z are substantially at the same height in the direction z as the island portions 130, 140, 150 and the pad portions 160, 170, 180. In other words, the island portions 110 and 120 are positioned lower in the direction z than the island portions 130, 140, 150 and the pad portions 160, 170, 180.

The terminal portions 111, 121, 141, 151, 161, 171, 181, 191 project from the sealing resin 700. Each of the terminal portions 111, 121, 141, 151, 161, 171, 181, 191 is bent at an angle close to 90° and has an end facing upward in the direction z. The terminal portions 111, 121, 141, 151, 161, 171, 181, 191 are used for mounting the semiconductor device A1 on e.g. a circuit board.

The terminal portion 111 is connected to the bent portion 114 and electrically connected to the island portion 110. The three terminal portions 121 are connected to the bent portions 124 and electrically connected to the island portions 120. Two terminal portions 141 are connected to the island portion 140. Three terminal portions 151 are connected to the three island portions 150, respectively. Three terminal portions 161 are connected to the three pad portions 160, respectively. The terminal portions 171 are connected to the pad portions 170, respectively. The terminal portion 181 is connected to the pad portion 180.

In this embodiment, all of the terminal portions 111, 121, 141, 151, 161, 171, 181, 191 are not equally spaced from each other. For instance, of the terminal portions 141, 151, 171, 181, which are aligned on one side in the direction y, the terminal portions 141, 171, 181 are arranged at equal intervals in the direction x. As compared to this, the interval between adjacent terminal portions 151 and the interval between the terminal portions 151 and the terminal portion 171 adjacent to the terminal portions 151 are clearly large. The grooves 710 of the sealing resin 700, which are described later, and the arcuate cutouts of the island portions 150 are located between the terminal portions 151 and between the terminal portion 171 and the terminal portions 151 arranged at larger intervals.

The terminal portion 191 is provided at a distant position on one of the two ends spaced in the direction x. In this embodiment, the terminal portion 191 is not electrically connected to the island portions 110, 120, 130, 140 or the semiconductor elements 410, 420, 430, 440.

Of the terminal portions 111, 121, 161 which are aligned on the other side in the direction y, the three terminal portions 161 are arranged at relatively small intervals. As compared to this, the interval between adjacent terminal portions 121 and the interval between the terminal portion 121 on each end and the adjacent terminal portion 111 or 161 are clearly large. The interval between the terminal portions 191 and the adjacent terminal portion 111 is larger than these intervals.

The intervals between the terminal portions 111, 121, 141, 151, 161, 171, 181, 191 are set as described above in view of the function of each terminal portion. For instance, when the semiconductor device A1 of this embodiment is configured as an IPM, three-phase alternating current having a U-phase, a V-phase and a W-phase is to be controlled by the semiconductor device A1. The three terminal portions 121 are assigned as the terminal portions for the U-phase, V-phase and W-phase, respectively. Moreover, to the three terminal portions 151, a relatively high voltage is applied. These terminal portions, to which a relatively large current or voltage is applied, are arranged at relatively large intervals, as described above.

The heat dissipation member 200 is provided mainly to dissipate heat from the semiconductor elements 410, 420 to the outside of the semiconductor device A1. In this embodiment, the heat dissipation member 200 is made of a ceramic material and in the form of a rectangular plate. Although a ceramic material is preferable as the material for the heat dissipation member of the present invention in terms of strength, thermal conductivity and insulating properties, other materials can be used if the use of such a material provides the effect the present invention aims for. Although it is preferable for the thickness reduction of the semiconductor device A1 that the heat dissipation member 200 is in the form of a plate, the heat dissipation member of the present invention may have other shapes.

The heat dissipation member 200 includes a bonding surface 210, an exposed surface 220 and a side surface 230. The bonding surface 210 and the exposed surface 220 face away from each other in the thickness direction of the heat dissipation member 200 and are parallel to each other. The bonding surface 210 is bonded to the island portion 110 and the three island portions 120 via a bonding layer 300. In this embodiment, as viewed in the direction z, the heat dissipation member 200 overlaps not only the island portions 110, 120 but also at least part of the island portions 130, 140. However, the heat dissipation member 200 is not bonded to the island portions 130, 140.

The bonding layer 300 bonds the heat dissipation member 200 and the island portions 110, 120 to each other. Preferably, the bonding layer 300 is configured to be able to properly bond the island portions 110, 120 made of e.g. Cu to the heat dissipation member 200 made of a ceramic material and have good thermal conductivity. For instance, an adhesive made of a resin having good thermal conductivity is used as the bonding layer 300.

Figure 19:
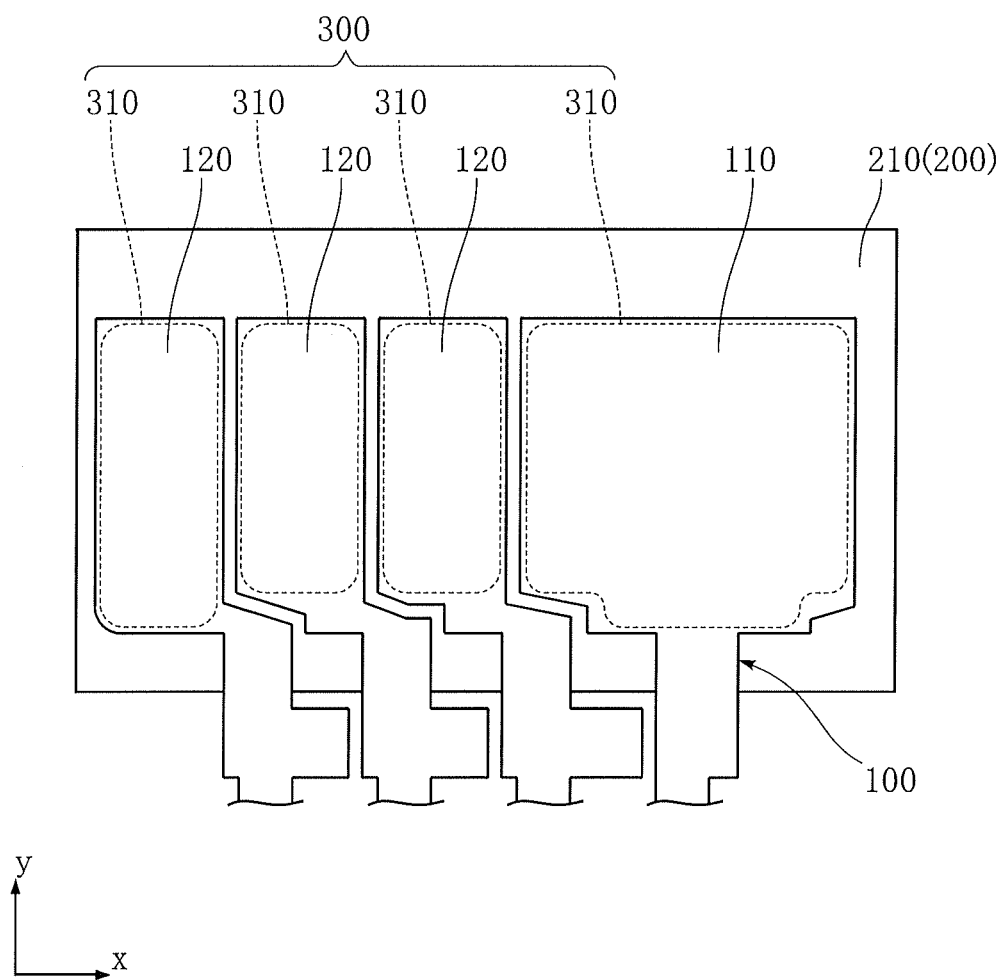
FIG. 19 is a schematic plan view illustrating island portions, a bonding layer and a heat dissipation member of the semiconductor device of FIG. 1.

FIG. 19 selectively illustrates the heat dissipation member 200, the island portions 110, 120 and the bonding layer 300 for easier understanding. As illustrated in the figure, in this embodiment, the bonding layer 300 is made up of a plurality of individual regions 310 are separate from each other. The individual regions 310 are formed correspondingly to the island portion 110 and the three island portions 120. Thus, the number of the individual regions 310 is four. In this embodiment, as viewed in the direction z, each of the individual regions 310 is smaller than the corresponding one of the island portions 110, 120, and the outer edge of each individual region 310 is located inward of the outer edge of the corresponding island portion 110, 120. With this arrangement of the bonding layer 300, the bonding surface 210 of the heat dissipation member 200 is exposed without being covered by the bonding layer 300 at portions between adjacent island portions 110, 120.

To bond the heat dissipation member 200 and the island portions 110, 120 to each other with the bonding layer 300, an adhesive to become the bonding layer 300 is printed in a pattern on the heat dissipation member 200. Then, with the island portions 110, 120 adhered to the pattern-printed adhesive, the adhesive is allowed to harden.

The exposed surface 220 is a surface exposed from the sealing resin 700. In use of the semiconductor device A1, the exposed surface 220 is brought into contact with e.g. a heat dissipation plate (not shown). In this embodiment, the exposed surface 220 is flush with a surface of the sealing resin 700 which surrounds the exposed surface 220.

The side surface 230 of the heat dissipation member 200 connects the bonding surface 210 and the exposed surface 220 to each other and extends in the thickness direction. In this embodiment, as viewed in the direction z, the side surface 230 is in the form of a rectangle made up of a plurality of lines. In other words, the side surface 230 extends along the entire periphery of the heat dissipation member 200. In this embodiment, the entirety of the side surface 230 is covered by the sealing resin 700.

Figure 11:
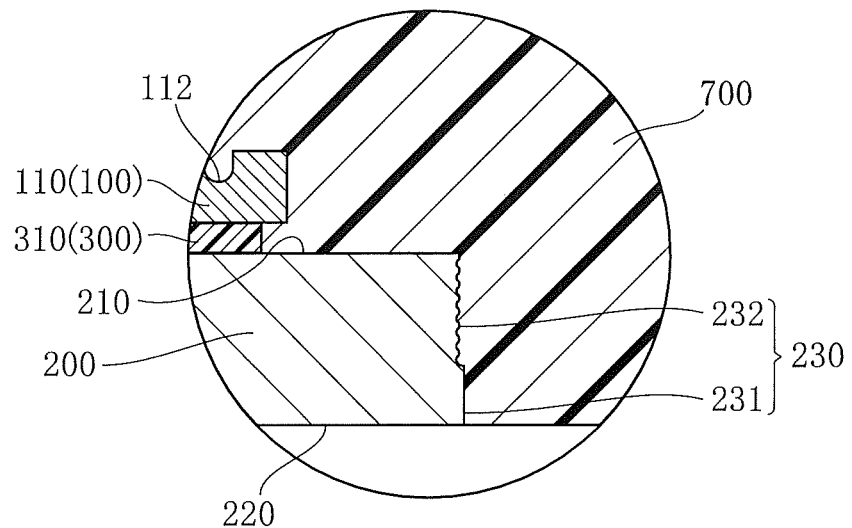
FIG. 11 is a schematic sectional view taken along lines IX-IX in FIG. 8.

FIG. 11 is a sectional view illustrating a principal portion of the section illustrated in FIG. 10 as enlarged. As shown in the figure, the side surface 230 of this embodiment includes a smooth portion 231 and a rough portion 232. The smooth portion 231 is positioned closer to the exposed surface 220 and connected to the exposed surface 220. The rough portion 232 is farther away from the exposed surface 220 than the smooth portion 231 is. The smooth portion 231 is a surface smoother than the rough portion 232. In other words, the rough portion 232 is a surface rougher than the smooth portion 231. In this embodiment, the smooth portion 231 is a surface extending along the direction z. The rough portion 232 also extends generally along the direction z. As viewed in the direction z, the rough portion 232 is positioned slightly inward of the smooth portion 231. In this embodiment, the boundary between the smooth portion 231 and the rough portion 232 extends along the direction x or the direction y and is parallel to the exposed surface 220.

Figure 12:
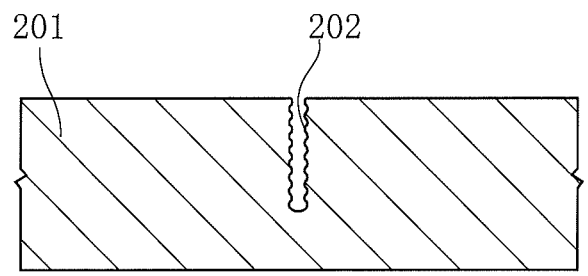
FIG. 12 is a schematic sectional view illustrating a plate material for forming a heat dissipation member.
Figure 13:
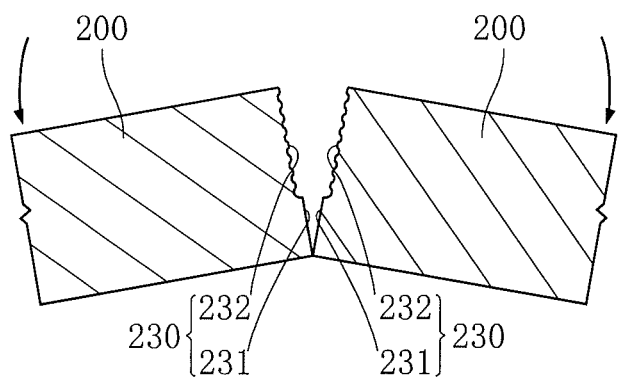
FIG. 13 is a schematic sectional view illustrating the step of dividing the plate material shown in FIG. 12.

FIG. 12 illustrates a ceramic material plate 201 used for making the heat dissipation member 200. The ceramic material plate 201 is formed with a groove 202. The groove 202 may be formed by laser processing. Alternatively, the groove 202 may be formed by forming a groove in a relatively soft ceramic material before hardening in the process of making the ceramic material plate 201. By dividing the ceramic material plate 201 along the groove 202, a plurality of heat dissipation members 200 are obtained as shown in FIG. 13. The portion which has been the groove 202 becomes the rough portion 232, and the broken surface formed by the division becomes the smooth portion 231.

Figure 14:
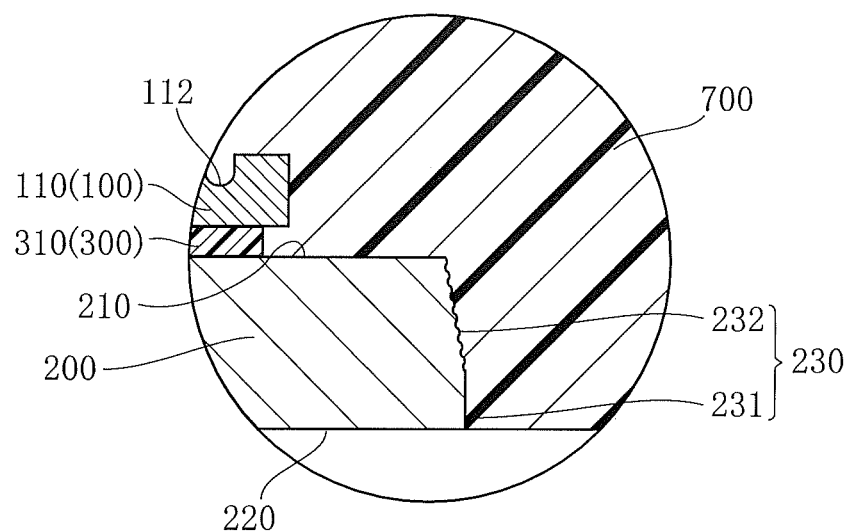
FIG. 14 is a schematic sectional view illustrating another example of the heat dissipation member.
Figure 15:
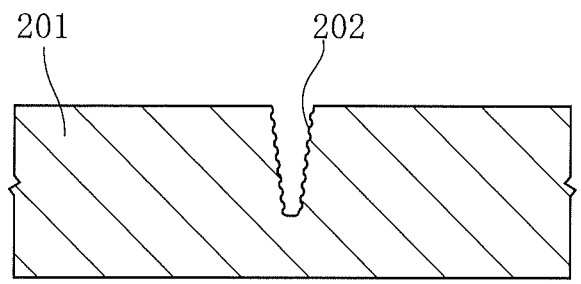
FIG. 15 is a schematic sectional view illustrating another example of the plate material for forming the heat dissipation member.

FIG. 14 illustrates a variation of the side surface 230. In this variation, the rough portion 232 is entirely inclined with respect to the direction x. Specifically, the rough portion 232 is inclined to deviate toward the left in the direction x in FIG. 14 (inward of the heat dissipation member 200) as proceeding upward in the direction z. The rough portion 232 of this type is formed when the ceramic material plate 201 is divided by using a V-shaped groove 202, as shown in FIG. 15. Generally, when laser processing is employed to make a groove, the groove has a V-shape like the groove shown in FIG. 15.

The semiconductor element's 410, 420, 430, 440 are functional elements to make the semiconductor device A1 function as an IPM. In this embodiment, the semiconductor elements 410, 420 are power semiconductor elements. The "power semiconductor element" in the present invention refers to e.g. an element into or from which three-phase electric current as the target of control by the IPM is inputted or outputted. Typical examples of the power semiconductor element include an IGBT (Insulated-Gate Bipolar Transistor), a MOSFET (Metal-Oxide-Semiconductor Field-effect Transistor) and a FRD (Fast Recovery Diode). Of these power semiconductor elements, the one which uses SiC as the base material may be employed. In this embodiment, for instance, the semiconductor elements 410 are IGBTs, whereas the semiconductor elements 420 are FRDs.

As shown in FIGS. 8-10, 16 and 17, each of the semiconductor elements 410 has a bottom surface 411, and includes a semiconductor main body, two upper-surface electrodes 412 and a bottom-surface electrode 413. The upper-surface electrodes 412 are formed on the upper surface of the semiconductor element 410 which faces upward in the direction z. The two upper-surface electrodes 412 may be embedded in the semiconductor main body (see FIG. 9) so that the upper surface of the semiconductor element 410 is entirely flat (i.e., has no difference in level). For instance, the upper-surface electrodes 412 are made of Au. Wires 600, 650 are bonded to the upper-surface electrodes 412. The bottom-surface electrode 413 is formed to cover the entire lower surface of the semiconductor element 410 (more precisely, the entire lower surface of the semiconductor main body). For instance, the bottom-surface electrode 413 is made of Au or Ag. The bottom surface 411 is bonded to the island portions 110, 120 via the bonding material 510. In this embodiment, the bottom surface 411 is provided by the bottom-surface electrode 413.

Each of the semiconductor elements 420 has a bottom surface 421, and includes a semiconductor main body, an upper-surface electrode 422 and a bottom-surface electrode 423. The upper-surface electrode 422 is formed on the upper surface of ° the semiconductor element 420 which faces upward in the direction z. For instance, the upper-surface electrode 422 is made of Au. The wire 650 is bonded to the upper-surface electrode 422. The bottom-surface electrode 423 is formed to cover the entire lower surface of the semiconductor element 420 (more precisely, the entire lower surface of the semiconductor main body). For instance, the bottom-surface electrode 423 is made of Au or Ag. The bottom surface 421 is bonded to the island portions 110, 120 via the bonding material 510. In this embodiment, the bottom surface 421 is provided by the bottom-surface electrode 423.

The bonding material 510 functions to bond the semiconductor elements 410 and 420 to the island portions 110 and 120. In this embodiment, solder is used as the bonding material 510. The solder as the bonding material 510 bonds the semiconductor elements 410 and 420 to the island portions 110 and 120 by hardening from the molten state. In this embodiment, since the bottom-surface electrodes 413, 423 of the semiconductor elements 410, 420 are made of Au or Ag while the island portions 110, 120 are made of Cu, the wettability of the bottom surfaces 411, 421 of the semiconductor elements 410, 420 to the solder, or the bonding material 510 in the molten state is higher than the wettability of the island portions 110, 120 to the solder.

Since the wettability to the bonding material 510 which is solder is as described above, in the process of mounting the semiconductor elements 410 and 420, solder in the molten state (bonding material 510) tends to adhere more to the bottom surfaces 411, 421 of the semiconductor elements 410, 420 than to the island portions 110, 120. In this embodiment, therefore, the contact area of the solder in the molten state (bonding material 510) with the bottom surfaces 411, 421 of the semiconductor elements 410, 420 becomes larger than the contact area of the solder with the island portions 110, 120. As a result, as shown in FIGS. 9, 10 and 17, the bonding material 510 has a shape that becomes larger as proceeding upward in the direction z. As viewed in the direction z, the bonding material 510 is smaller than the semiconductor element 410, 420, and the outer edge of the bonding material 510 is positioned inward of the outer edge of the semiconductor element 410, 420. Thus, the bonding material 510 is positioned inward of the trench 113, 123.

To mount the semiconductor elements 410 and 420, solder paste which is to become the bonding material 510 is applied to the island portions 110 and 120. In this process, the solder paste is applied to the region of the island portion 110, 120 which is surrounded by the trench 113, 123. Preferably, the solder paste is applied to be as distant from the trench 113, 123 as possible.

The semiconductor elements 430, 440 are semiconductor devices configured for implementing required control with respect to the power semiconductor elements. In the illustrated embodiment, each of the semiconductor elements 430, 440 is a driver IC. More specifically, The semiconductor element 430 is a high-voltage driver IC for coping with a relatively high voltage current, whereas the semiconductor element 440 is a low-voltage driver IC for coping with a relatively low voltage current.

Referring to FIG. 3, the semiconductor elements 430, 440 have upper-surface electrodes 432, 442 to which wires 600 are bonded at an end. As shown in FIG. 7, the semiconductor element 430 is bonded to the island portion 130 via a bonding material 520. For instance, the bonding material 520 is Ag paste. The semiconductor element 440 is also bonded to the island portions 140 via a bonding material 520 which is e.g. Ag paste.

The passive components 490 are electronic components having a single function such as a resistor, a capacitor or a coil. In this embodiment, the passive components 490 act on the current flowing to the semiconductor element 430. The passive components 490 are bonded to the island portions 150 via a bonding material 520. Wires 600 are bonded to the upper surfaces of the passive components 490 in the direction z.

The wires 600 and the wires 650 provide, along with the lead 100, an electrical conduction path for allowing the semiconductor elements 410, 420, 430, 440 and the passive components 490 to perform predetermined functions. In this embodiment, the wires 600 provide an electrical conduction path for flowing a relatively small current, whereas the wires 650 provide an electrical conduction path for flowing a relatively large current. For instance, the wires 600 are made of Au and about 38 µm in diameter. For instance, the wires 650 are made of Al and about 400 µm in diameter.

Figure 20:
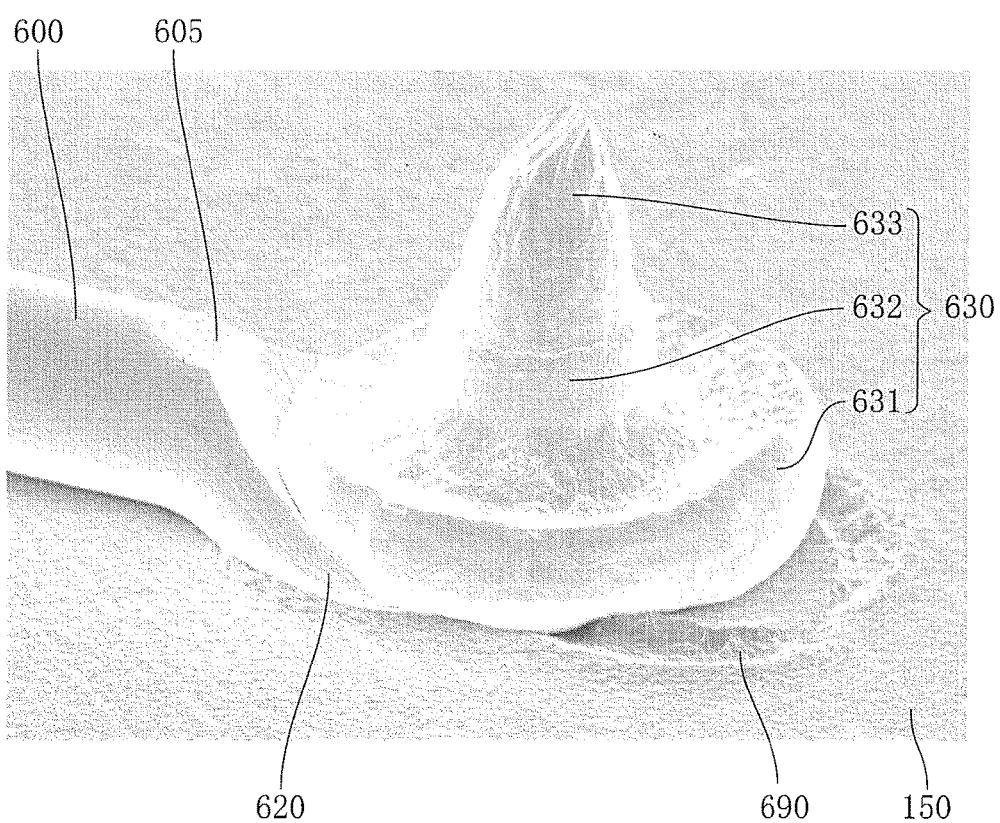
FIG. 20 is a photograph of a wire of the semiconductor device of FIG. 1.

FIG. 20 is a magnified photograph showing a part of the wire 600. FIGS. 21-29 illustrate an example of a wire bonding process for forming the wire 600. As shown in FIG. 20, the wire 600 includes a second bonding portion 620, a stepped portion 605 and a reinforcing bonding portion 630. As understood from FIG. 23, the wire 600 has a first bonding portion 610 as well.

FIGS. 21-29 illustrate a wire bonding process, taking the wire 600 for connecting the upper-surface electrode 432 of the semiconductor element 430 and the island portion 150 as an example. All the wires 600 of this embodiment are formed by the same wire bonding process.

Figure 21:
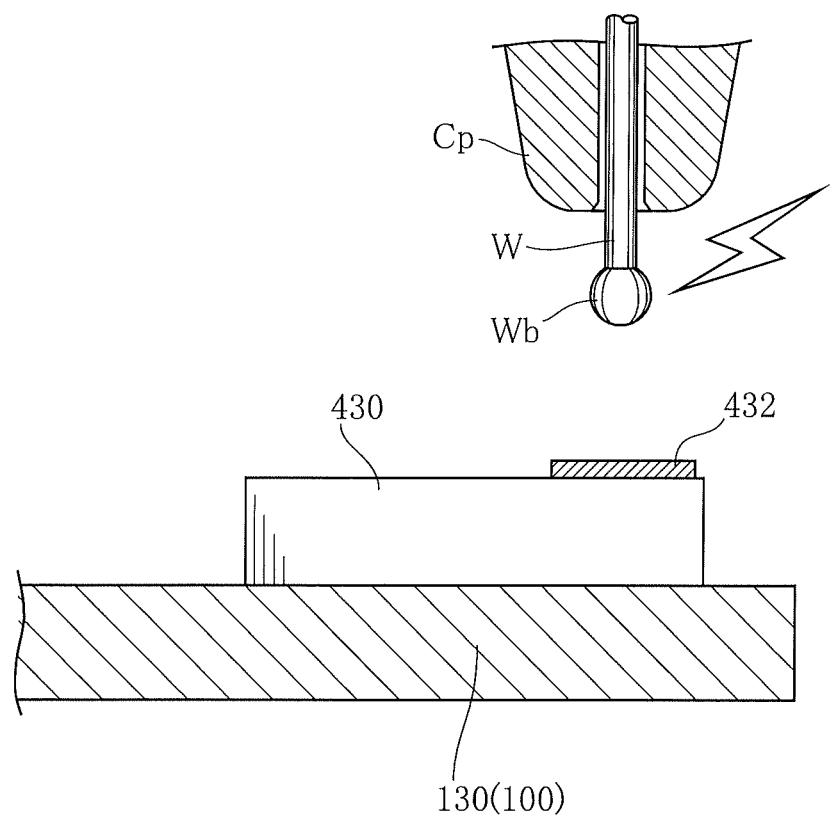
FIG. 21 is a schematic sectional view illustrating a process of making a wire of the semiconductor device of FIG. 1.

First, as shown in FIG. 21, a capillary Cp is prepared. The capillary Cp has a cylindrical shape with a through-hole and a gently curved end. The capillary Cp is capable of paying out a wire W made of Au which is the material for the wire 600. After the wire W is paid out from the capillary Cp, a spark is applied to the end of the wire W, whereby a ball Wb is formed.

Figure 22:
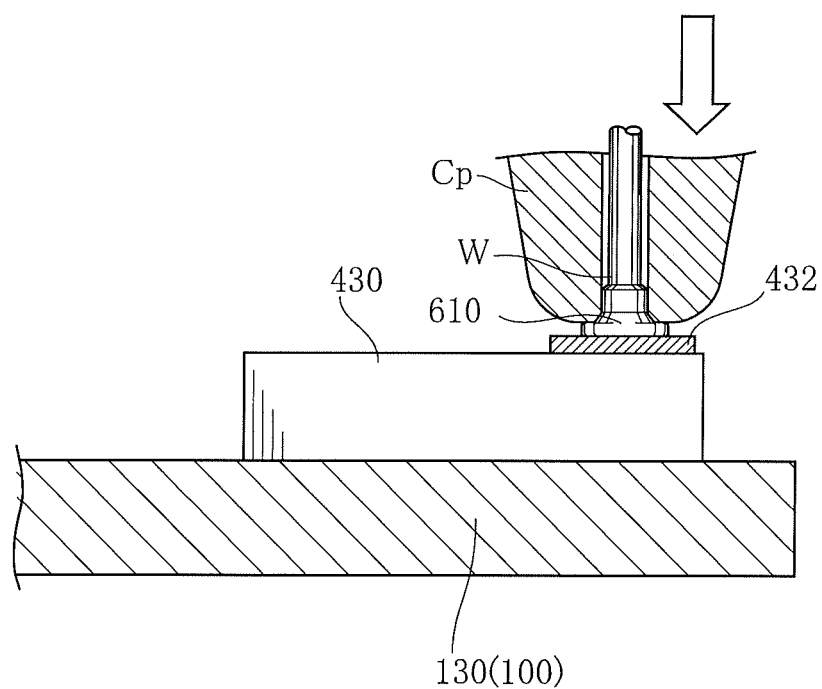
FIG. 22 is a schematic sectional view illustrating a process of making a wire of the semiconductor device of FIG. 1.

Then, as shown in FIG. 22, the capillary Cp is moved down to press the ball Wb against the upper-surface electrode 432 of the semiconductor element 430. By this operation, the ball Wb is squashed by the upper-surface electrode 432 and the end of the capillary Cp. The squashed ball Wb becomes the first bonding portion 610, which is the portion bonded to the upper-surface electrode 432.

Figure 23:
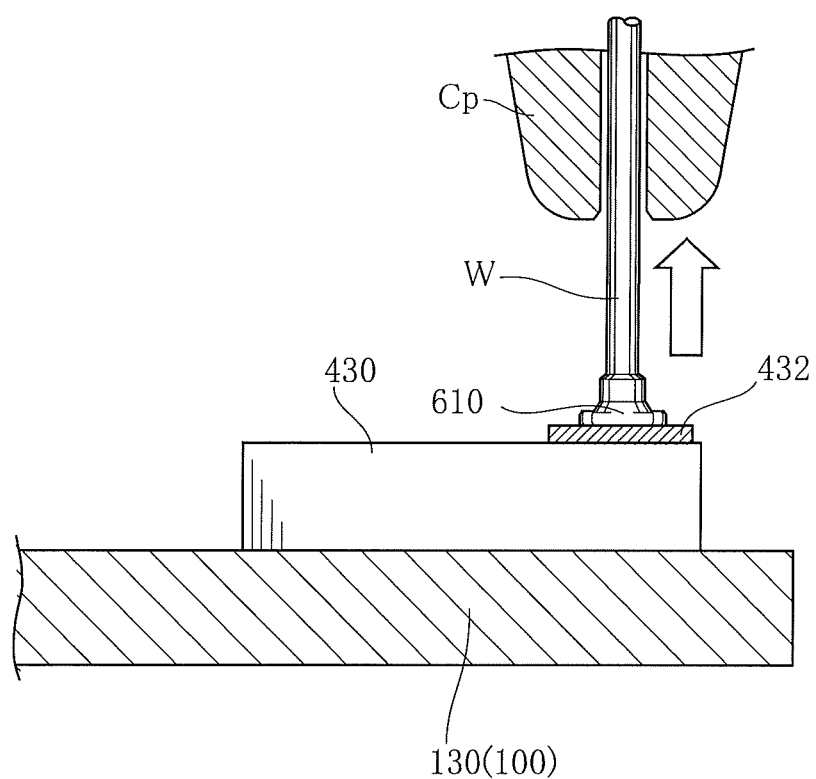
FIG. 23 is a schematic sectional view illustrating a process of making a wire of the semiconductor device of FIG. 1.
Figure 24:
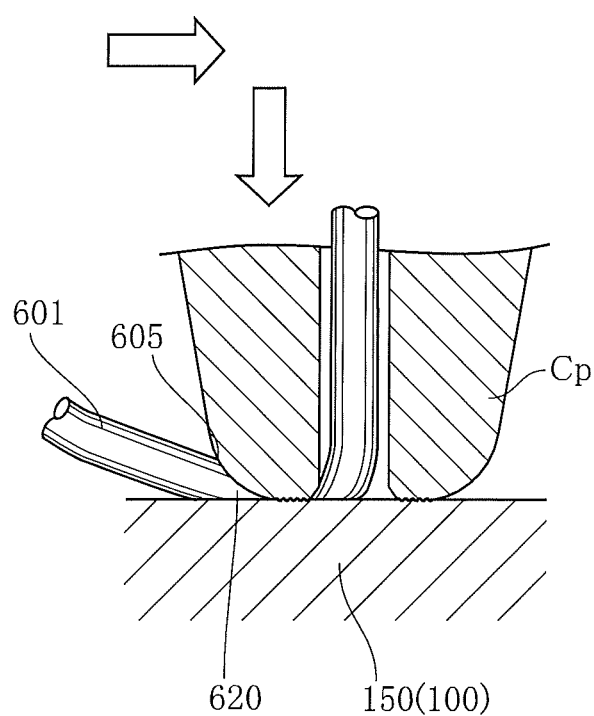
FIG. 24 is a schematic sectional view illustrating a process of making a wire of the semiconductor device of FIG. 1.

Then, as shown in FIG. 23, the capillary Cp is moved upward and then moved to a position directly above the island portion 150 while paying out the wire W. Then, the capillary Cp is moved downward, whereby the end of the capillary Cp is pressed against the island portion 150. By this operation, the wire W is sandwiched between the end of the capillary Cp and the island portion 150 and cut. By this cutting, the wire 601 is provided which is bonded to the upper-surface electrode 432 of the semiconductor element 430 and the island portion 150.

Of the wire 601, the portion bonded to the island portion 150 is the second bonding portion 620. The second bonding portion 620 is the portion of the wire W which is deformed by the end of the capillary Cp. The wire 601 has a stepped portion 605 at the boundary between the portion that has been in contact with the capillary Cp and the portion that has not been in contact with the capillary Cp. The wire 601 is circular in cross section at the portions closer to the first bonding portion 610 than the stepped portion 605 is. On the other hand, the second bonding portion 620, which is closer to the cut end of the wire than the stepped portion 605 is, becomes smaller in thickness as proceeding toward the cut end.

Figure 25:
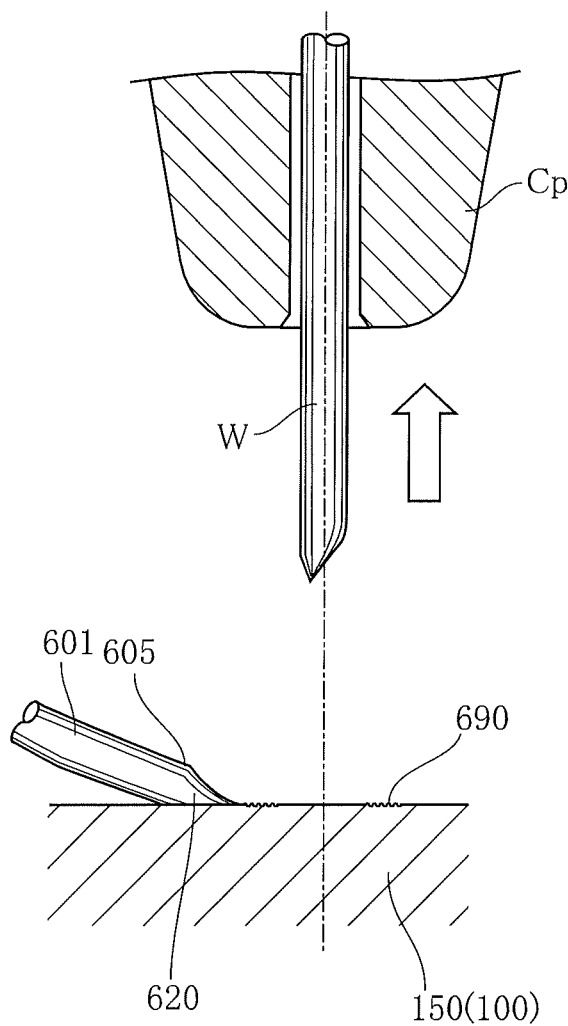
FIG. 25 is a schematic sectional view illustrating a process of making a wire of the semiconductor device of FIG. 1.

Then, as shown in FIG. 25, with the paying out of the wire W stopped, the capillary Cp is moved upward. A trace 690 of the capillary CP is left on the island portion 150 at the portion which the capillary Cp has been pressed against and in direct contact with. The trace 690 has a shape corresponding to the shape of the end of the cylindrical capillary Cp and e.g. annular.

Figure 26:
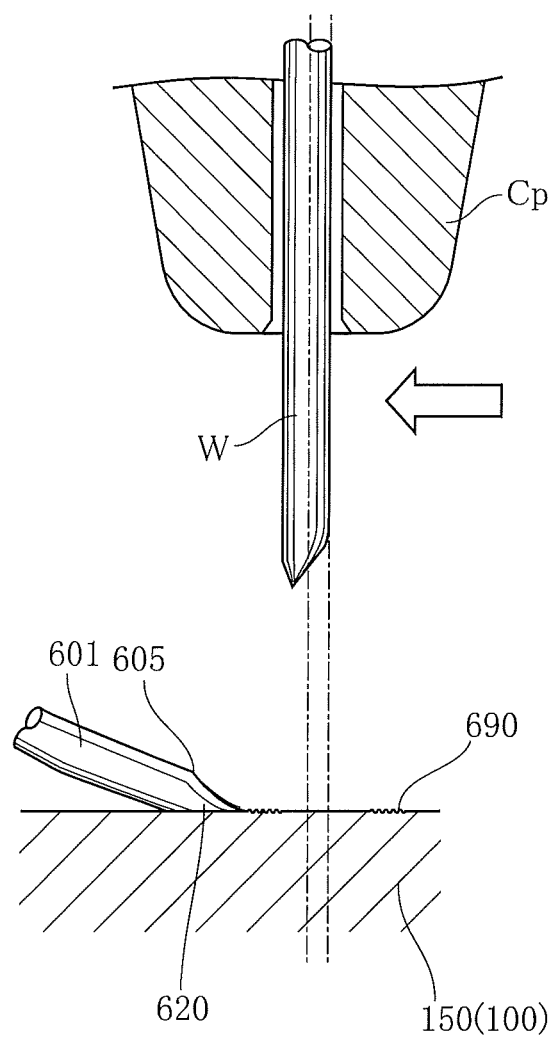
FIG. 26 is a schematic sectional view illustrating a process of making a wire of the semiconductor device of FIG. 1.

Then, as shown in FIG. 26, the capillary Cp is slightly moved to the left in the figure. By this movement, the center axis (indicated by the single-dashed lines in the figure) of the capillary Cp is shifted toward the second bonding portion 620. Then, as shown in FIG. 27, a ball Wb is formed at the end of the wire W.

Figure 28:
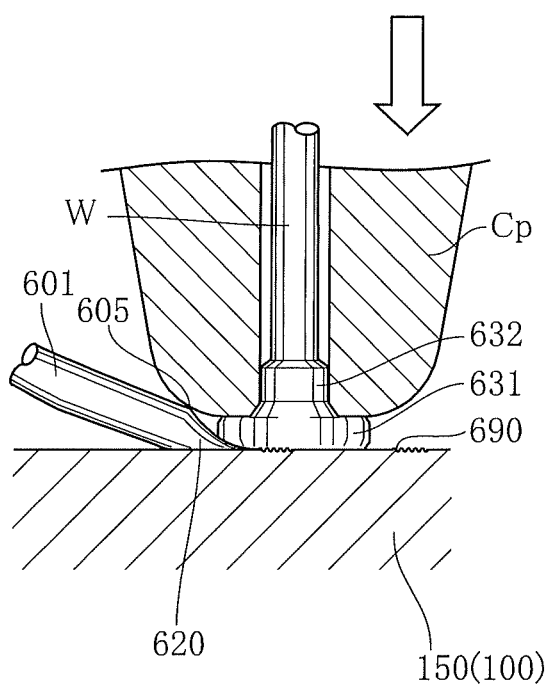
FIG. 28 is a schematic sectional view illustrating a process of making a wire of the semiconductor device of FIG. 1.

Then, as shown in FIG. 28, the capillary Cp is moved downward. By this operation, the ball Wb is squashed by the island portion 150 and the end of the capillary Cp. The squashed ball Wb becomes a disk portion 631 and a columnar portion 632. The disk portion 631 is the portion sandwiched and spread between the end of the capillary Cp and the island portion 150. The columnar portion 632 is the portion deformed along the through-hole of the capillary Cp at the end of the through-hole with a large compressive force. The columnar portion 632 is smaller in diameter than the disk portion 631.

Figure 29:
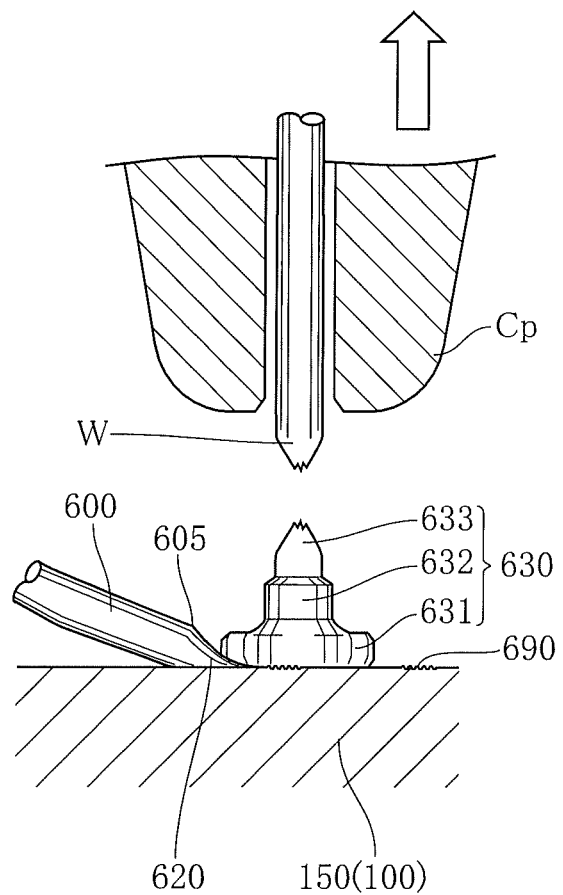
FIG. 29 is a schematic sectional view illustrating a process of making a wire of the semiconductor device of FIG. 1.

Then, as shown in FIG. 29, the capillary Cp is moved upward, whereby the wire W is cut. In this way, a reinforcing bonding portion 630 is provided which includes a peak portion 633 in addition to the disk portion 631 and the columnar portion 632. The peak portion 633 is the portion having a shape sticking upward as a result of the pulling and cutting of the wire W. In this way, the wire 600 is completed.

In this embodiment, as shown in FIGS. 20 and 29, the reinforcing bonding portion 630 overlaps at least a part of the second bonding portion 620 and exposes the stepped portion 605. The reinforcing bonding portion 630 exposes a portion of the trace 690 which is on the opposite side of the second bonding portion 620. Specifically, the reinforcing bonding portion 630 covers a half or more of the trace 690 on the opposite side of the second bonding portion 620.

In this embodiment, the wires 600 other than the above-described wire 600 are also appropriately formed with the reinforcing bonding portions 630. The first bonding portions 610 of the wires 600 shown in FIG. 3 are bonded to the upper-surface electrode 432 of the semiconductor element 430 or the upper-surface electrode 442 of the semiconductor element 440. The second bonding portions 620 of the wires 600 are bonded to the upper-surface electrodes 412 of the semiconductor elements 410, the passive components 490, the island portions 150 and the pad portions 170, 180.

The sealing resin 700 covers the lead 100, the semiconductor elements 410, 420, 430, 440, the passive components 490 and the wires 600, 650 partially or entirely. For instance, the sealing resin 700 is made of a black epoxy resin.

As shown in FIG. 2, the sealing resin 700 is formed with four grooves 710 and two grooves 720. The four grooves 710 are dented in the direction y and elongated in the direction z. The grooves 710 are provided between adjacent terminal portions 151, between a terminal portion 171 and the adjacent terminal portion 151, and at a position adjacent one of the terminal portion 151. As shown in FIG. 3, correspondingly to these grooves 710, arcuate cutouts are formed in the island portions 150. As noted above, the intervals between the three terminal portions 151 are made relatively large.

The two grooves 720 are provided at the two ends spaced apart from each other in the direction x. The two grooves 720 are dented in the direction x and elongated in the direction z. For instance, the grooves 720 may be utilized in transferring or mounting the semiconductor device A1.

As understood from FIGS. 6, 7, 9, 10 and 17, the recesses 112, 122, 132, 142, 152, 182 and the trenches 113, 123 of the lead 100 are filled with the sealing resin 700. In this embodiment, the sealing resin 700 covers the entirety of the side surface 230 of the heat dissipation member 200. The surface of the sealing resin 700 which faces downward in the direction z is flush with the exposed surface of the heat dissipation member 200.

Figure 18:
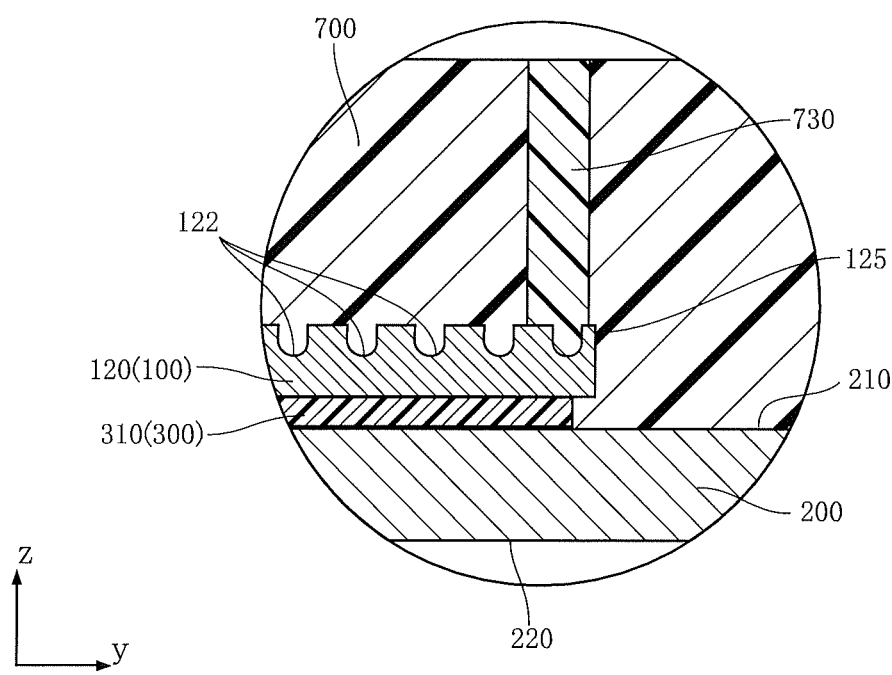
FIG. 18 is a schematic enlarged sectional view taken along lines XVIII-XVIII in FIG. 16.

As shown in FIG. 18, the sealing resin 700 includes a subsequent portion 730. The subsequent portion 730 is made of the same material as the other portions of the sealing resin 700, but made at a different timing (after the above-mentioned other portions are formed). Thus, the subsequent portion 730 exists as a trace implying the manufacturing order.

For instance, in the process of making the semiconductor device A1, the sealing resin is formed by using a die nearly at the end of the process. In this step, as to the island portion 120 shown in FIG. 16, the portion which is to become the terminal portion 121 supports the island portion 120. Thus, the portion of the island portion 120 which is on the opposite side of the terminal portion 121 is not reliably supported and can be unstable. Thus, before loading a resin material in a liquid state into the mold, a portion adjacent to the corner 125 of the island portion 120 is pressed by a rod member. In this state, the resin material is loaded and allowed to harden. After the resin is hardened to a certain degree, the rod member is removed, and resin material is quickly loaded into the space formed by removing the rod member. The portion formed in this way by the later loading of the resin material is the subsequent portion 730 shown in FIG. 18. Thus, the subsequent portion 730 is provided at a position closer to the corner 125 than to the arcuate portion 126 of the island portion 120 and reaches the obverse surface of the sealing resin 700 and is in the form of a column elongated in the direction z in this embodiment.

The advantages of the semiconductor device A1 are described below.

According to this embodiment, as shown in FIG. 19, the bonding layer 300 includes a plurality of individual regions 310 that are separate from each other and provided for the respective island portions 110, 120. The bonding surface 210 of the heat dissipation member 200 is exposed without being covered by the bonding layer 300 at portions between adjacent ones of the island portions 110, 120. As shown in FIG. 6, the sealing resin 700 is in contact with the exposed portions of the heat dissipation member 200. The heat dissipation member 200 made of e.g. a ceramic material is bonded to the sealing resin 700 made of e.g. an epoxy resin with a relatively high bonding strength. Thus, detachment of the sealing resin 700 is prevented at the portions between the island portions 110, 120. Thus, in selecting the material for the bonding layer 300, the bonding strength of the material with the sealing resin 700 does not need to be much considered. Thus, as the material for the bonding layer 300, a material that can properly bond the heat dissipation member 200 and the island portions 110, 120 and that has good thermal conductivity can be selected.

As shown in FIG. 19, the outer edges of the individual regions 310 are positioned inward of the outer edges of the island portions 110, 120 as viewed in the direction z. This allows the heat dissipation member 200 to be exposed as much as possible between the island portions 110, 120. This arrangement is suitable for the prevention of detachment of the sealing resin 700.

In this embodiment, four individual regions 310 are provided correspondingly to the single island portion 110 and the three island portions 120. This arrangement allows the heat dissipation member 200 to be exposed between each of the gaps between adjacent ones of the island portions 110, 120. This arrangement is suitable for the prevention of detachment of the sealing resin 700.

The island portions 110, 120, on which the semiconductor elements 410, 420 are mounted, have relatively large areas. According to this embodiment, in spite of such large areas, the island portions 110, 120 can be bonded reliably by selecting a suitable material for the bonding layer 300 in view of the bonding strength and the thermal conductivity.

According to this embodiment, as shown in FIG. 11, the side surface 230 of the heat dissipation member 200 has the smooth portion 231 and the rough portion 232. Since the smooth portion 231 is relatively smooth, moisture may enter the boundary between the smooth portion 231 and the sealing resin 700 relatively easily. On the other hand, since the rough portion 232 is a relatively rough surface, the rough portion 232 and the sealing resin 700 are closely bonded to each other. Thus, even if moisture enters along the smooth portion 231, further ingress of moisture is prevented by the portion where the rough port ion 232 and the sealing resin 700 are bonded to each other. Thus, separation of the sealing resin 700 and the heat dissipation member 200 is prevented.

Since the side surface 230 is formed along the entire edge of the heat dissipation member 200, ingress of moisture and so on is prevented along the entire edge of the heat dissipation member 200. Since the side surface 230 is entirely covered by the sealing resin 700, ingress of moisture and so on is more reliably prevented. Since the exposed surface 220 is flush with the sealing resin 700, at the outer end of the boundary between the side surface 230 and the sealing resin 700, the heat dissipation member 200 and the sealing resin 700 are in close contact with each other. This also contributes to prevention of moisture ingress. Moreover, since the boundary between the smooth portion 231 and the rough portion 232 is parallel to the exposed surface 220, ingress of moisture and so on is prevented uniformly at the side surface 230.

Moreover, in this embodiment, each wire 600 has the reinforcing bonding portion 630 overlapping the second bonding portion 620. The reinforcing bonding portion 630 does not cover the stepped portion 605 where the diameter of the wire 600 suddenly reduces. However, the reinforcing bonding portion 630 reliably covers the part of the second bonding portion 620 which has a small thickness. This arrangement enhances the bonding strength of the relatively thin second bonding portions 620 to the island portions 150, the upper-surface electrodes 412 of the semiconductor elements 410, the passive components 490 and the pad portions 170, 180, and thereby prevents detachment of the wires 600.

As shown in FIG. 20, the reinforcing bonding portion 630 exposes a part of the trace 690. The trace 690 is the trace of the capillary Cp pressed in forming the second bonding portion 620. To provide the reinforcing bonding portion 630 at a position that exposes the trace 690 means that the reinforcing bonding portion 630 is prevented from being positioned unduly far away from the second bonding portion 620. This reliably prevents detachment of the second bonding portion 620. The reinforcing bonding portion 630 covers a half or more of the trace 690, which means that the reinforcing bonding portion 630 covers a large portion of the second bonding portion 620. This is suitable for the prevention of detachment of the second bonding portion 620.

In this embodiment, as described with reference to FIGS. 9, 10 and 17, the bottom surfaces 411, 412 of the semiconductor elements 410, 420 have higher wettability to the bonding material 510 in a molten state than the island portions 110, 120. Thus, the bonding material 510 in a molten state spreads across the bottom surfaces 411, 412 of the semiconductor elements 410, 420, while the contact surface with the island portions 110, 120 is reduced. As a result, when the bonding material 510 is hardened, the contact portion of the bonding material 510 with the island portions 110, 120 is relatively small, whereby the thickness of the bonding material 510 increases. Thus, even when thermal stress is applied on the bonding portions of the semiconductor elements 410, 420 and the island portions 110, 120, the thermal stress is absorbed by the bonding material 510, so that detachment of the semiconductor elements 410, 420 is prevented.

The provision of the bottom-surface electrodes 413, 423 on the semiconductor elements 410, 420 is suitable for enhancing the wettability of the bottom surfaces 411, 421 to the bonding material 510 in a molten state. The thickness of the bonding material 510 is increased by forming the bottom-surface electrodes 413, 423 on the entire lower surfaces of the semiconductor elements 410, 420. The bottom-surface electrodes 413, 423 made of Au or Ag is suitable for enhancing the wettability to the bonding material 510 which is solder.

Since the island portions 110, 120 are formed with the trenches 113, 123, the bonding material 510 in a molten state is prevented from unduly spreading. Even when the bonding material 510 in the molten state flows to the trench 113, the bonding material 510 cannot spread beyond the edge of the trench 113 due to surface tension, whereby the molten bonding material 510 is stopped. Since the trenches 113, 123 surround the entire semiconductor elements 410, 420, spreading of the bonding material 510 is reliably prevented.

According to this embodiment, the recess 112, 122, 132, 142, 152, 182 are provided at appropriate portions of the lead 100. Since the sealing resin 700 enters the recesses 112, 122, 132, 142, 152, 182, the bonding strength of the sealing resin 700 to the lead 100 is enhanced. Thus, separation of the lead 100 from the sealing resin 700 is prevented.

The island portions 110, 120 are not formed with the recesses 112, 122 at portions which overlap the semiconductor elements 410, 420, and these portions are made flat. Thus, bonding of the semiconductor elements 410, 420 by using the bonding material 510 is achieved properly. Moreover, in the island portions 110, 120, a plurality of recesses 112, 122 are arranged so as to surround the semiconductor elements 410, 420. With this arrangement, the sealing resin 700 is strongly bonded to the island portions 110, 120 around the semiconductor elements 410, 420. Thus, detachment of the sealing resin 700 is prevented, which also prevents generation of gaps leading to the semiconductor elements 410, 420 due to detachment of the sealing resin 700. Since such gaps are not formed, insulation of the semiconductor elements 410, 420 is properly maintained.

As shown in FIG. 16, the island portion 120 is provided with the arcuate portion 126. Detachment of the sealing resin 700 from the lead 100 is unlikely to occur from the arcuate portion 126 having a gently curved shape. Thus, provision of the arcuate portion 126 contributes to prevention of detachment of the sealing resin 700 from the lead 100. On the other hand, owing to the provision of the corners 125, the island portion 120 secures a certain amount of area at a portion close to its end. As described with reference to FIG. 18, this portion can be used to hold the island portion 120 in the process of forming the sealing resin 700.

Since the corners 125 are spaced farther away from the terminal portion 121 than the semiconductor elements 410, 420 are, the island portion 120 can be held stably. The fact that the arcuate portion 126 is closer to the terminal portion 121 than the semiconductor elements 410, 420 are means that the arcuate portion 126 is closer to the outer surface of the sealing resin 700 than the semiconductor elements 410, 420 are. Generally, the effect of e.g. thermal stress is larger at portions closer to the outer surface of the sealing resin 700. Since the arcuate portion 126 is provided at such a portion where detachment is more likely to occur, detachment of the sealing resin 700 is effectively prevented.

FIG. 30 shows a semiconductor device according to a second embodiment of the present invention. In this figure, the elements that are identical or similar to those of the foregoing embodiment are designated by the same reference signs as those used for the first embodiment.

The semiconductor device A2 of this embodiment differs from the above-described embodiment in structure of the island portions 110, 120. In this embodiment, the island portion 110 includes corners 115 and arcuate portions 116. Moreover, each of the island portions 120 has corners 125 and an arcuate portion 126.

The corners 115 are provided at the upper end in the figure (i.e. on the side farther away from the terminal portion 111). The arcuate portion 116 is provided on the lower end in the figure (i.e. on the side closer to the terminal portion 111). The corners 115 are on the upper side of the semiconductor elements 410, 420 in the figure (on the side farther away from the terminal portion 111), whereas the arcuate portion 116 is on the lower side of the semiconductor elements 410, 420 i.e. on the side closer to the terminal portion 111). At each of the corners 115, two sides of the island portion 120 are connected to each other to form an angle of 90°. At each arcuate portion 116, two sides of the island portion 120 are connected to each other to form an arc.

According to this embodiment, in the process of forming the sealing resin 700, all the island portions 110, 120 are reliably fixed so that detachment of the sealing resin 700 is reliably prevented.

The semiconductor device according to the present invention is not limited to the foregoing embodiments. The specific structure of each part of the semiconductor device according to the present invention may be varied in design in many ways.

The structures of the present invention and the variations are described below as appendixes.

APPENDIX 1A

A semiconductor device comprising:
a semiconductor element;
a lead including an island portion on which the semiconductor element is mounted;
a heat dissipation member for dissipating heat from the island portion; and
a sealing resin covering the semiconductor element, the island portion and a part of the heat dissipation member, wherein:
the heat dissipation member is made of a ceramic material and includes an exposed surface exposed from the sealing resin and a side surface connected to the exposed surface and at least partially covered by the sealing resin, and
the side surface includes a smooth port ion that is relatively smooth and positioned closer to the exposed surface and a rough portion that is relatively rough and positioned farther away from the exposed surface than the smooth portion is.

APPENDIX 2A

The semiconductor device according to Appendix 1A, wherein the side surface is provided along an entire periphery of the heat dissipation member.

APPENDIX 3A

The semiconductor device according to Appendix 1A or 2A, wherein the side surface is entirely covered by the sealing resin.

APPENDIX 4A

The semiconductor device according to any one of Appendixes 1A-3A, wherein the exposed surface is flush with the sealing resin.

APPENDIX 5A

The semiconductor device according to any one of Appendixes 1A-4A, wherein the rough portion is positioned inward of the smooth portion as viewed in plan.

APPENDIX 6A

The semiconductor device according to any one of Appendixes 1A-5A, wherein the smooth portion is perpendicular to the exposed surface.

APPENDIX 7A

The semiconductor device according to any one of Appendixes 1A-6A, wherein the rough portion is inclined so as to be shifted inward as viewed in plan as proceeding farther away from the exposed surface.

APPENDIX 8A

The semiconductor device according to any one of Appendixes 1A-7A, wherein the side surface comprises a plurality of portions which are linear as viewed in plan.

APPENDIX 9A

The semiconductor device according to Appendix 8A, wherein the heat dissipation member is rectangular.

APPENDIX 10A

The semiconductor device according to any one of Appendixes 1A-9A, wherein a boundary between the smooth portion and the rough portion is parallel to the exposed surface.

APPENDIX 11A

The semiconductor device according to any one of Appendixes 1A-10A, wherein
two semiconductor elements are provided,
the lead includes two island portions on which the semiconductor elements are mounted, respectively,
the semiconductor device further comprises a bonding layer that bonds the two island portions and the heat dissipation member to each other,
the bonding layer includes two individual regions provided for the respective island portions and separate from each other.

APPENDIX 12A

The semiconductor device according to Appendix 11A, wherein each of the individual regions has an outer edge positioned inward of an outer edge of a corresponding one of the island portions as viewed in plan.

APPENDIX 13A

The semiconductor device according to Appendix 11A or 12A, wherein the heat dissipation member is in a form of a plate.

APPENDIX 14A

The semiconductor device according to any one of Appendixes 11A-13A, wherein the semiconductor element is a power semiconductor element.

APPENDIX 15A

The semiconductor device according to any one of Appendixes 11A-14A, wherein:
a plurality of the semiconductor elements are provided;
the lead includes a plurality of the island portions; and
the bonding layer includes the same number of the individual regions as the island portions.

APPENDIX 16A

The semiconductor device according to Appendix 15A, wherein two or more of the semiconductor elements are mounted on at least one of the plurality of island portions.

APPENDIX 17A

The semiconductor device according to Appendix 15A or 16A, wherein the plurality of island portions are aligned in one direction.

APPENDIX 18A

The semiconductor device according to any one of Appendixes 15A-17A, wherein the lead includes a plurality of terminal portions connected to the island portions, respectively, and exposed from the sealing resin.

APPENDIX 19A

The semiconductor device according to any one of Appendixes 11A-18A, wherein each of the island portions is formed with a plurality of recesses.

APPENDIX 20A

The semiconductor device according to any one of Appendix 19A, wherein the recesses are arranged so as to surround the semiconductor element.

APPENDIX 1B

A semiconductor device comprising:
a semiconductor element;
a lead on which the semiconductor element is mounted; and
a wire bonded to the semiconductor element,
wherein the wire includes a first bonding portion, a second bonding portion that gradually reduces in thickness from a boundary provided by a stepped portion, and a reinforcing bonding portion that overlaps at least apart of the second bonding portion and exposes the stepped portion.

APPENDIX 2B

The semiconductor device according to Appendix 1B, wherein the reinforcing bonding portion includes a disk portion that is in contact with the second bonding portion.

APPENDIX 3B

The semiconductor device according to Appendix 2B, wherein the reinforcing bonding portion includes a columnar portion that is formed on the disk portion, smaller in diameter than the disk portion and concentric with the disk portion.

APPENDIX 4B

The semiconductor device according to Appendix 3B, wherein the reinforcing bonding portion includes a peak portion formed on the columnar portion.

APPENDIX 5B

The semiconductor device according to any one of Appendixes 1B-4B, wherein a portion at which the second bonding portion is bonded is formed with a trace generated by pressing a capillary in forming the second bonding portion.

APPENDIX 6B

The semiconductor device according to Appendix 5B, wherein the reinforcing bonding portion exposes a part of the trace.

APPENDIX 7B

The semiconductor device according to Appendix 6B, wherein the reinforcing bonding portion covers a half or more of the trace which is on a side closer to the second bonding portion.

APPENDIX 8B

The semiconductor device according to any one of Appendixes 1B-7B, wherein the first bonding portion is bonded to the semiconductor element.

APPENDIX 9B

The semiconductor device according to Appendix 8B, wherein the second bonding portion is bonded to an additional semiconductor element.

APPENDIX 10B

The semiconductor device according to Appendix 8B, wherein the second bonding portion is bonded to the lead.

APPENDIX 11B

The semiconductor device according to any one of Appendixes 1B-10B, wherein the wire is made of Au.

APPENDIX 12B

The semiconductor device according to any one of Appendixes 1B-11B, wherein:
the lead includes an island portion on which the semiconductor element is mounted,
the semiconductor device further comprises a sealing resin covering the semiconductor element and the island portion, and
the island portion is formed with a plurality of recesses.

APPENDIX 13B

The semiconductor device according to Appendix 12B, wherein the island portion has a smooth surface at a portion that overlaps the semiconductor element.

APPENDIX 14B

The semiconductor device according to Appendix 12B or 13B, wherein each of the recesses is circular in cross section.

APPENDIX 15B

The semiconductor device according to one of Appendixes 12B-14B, wherein the recesses are arranged so as to surround the semiconductor element.

APPENDIX 16B

The semiconductor device according to any one of Appendixes 12B-15B, wherein the recesses are arranged in a matrix.

APPENDIX 17B

The semiconductor device according to Appendix 16B, wherein the recess are arranged at equal intervals.

APPENDIX 18B

The semiconductor device according to any one of Appendixes 12B-17B, wherein the lead includes a pad portion on which the semiconductor element is not mounted and a wire is connected, and
the pad portion is formed with a plurality of recesses.

APPENDIX 19B

The semiconductor device according to any one of Appendixes 12B-18B, wherein:
each of the semiconductor elements has a bottom surface,
the semiconductor device further comprises a bonding material that bonds the bottom surface and the island portion to each other after being in a molten state, and
the bottom surface of the semiconductor element has a higher wettability to the bonding material in a molten state than that of the island portion.

APPENDIX 20B

The semiconductor device according to Appendix 19B, wherein the island portion includes a trench positioned on an outer side of the semiconductor element.

APPENDIX 21B

The semiconductor device according to Appendix 20B, wherein the bonding material is positioned inward of the trench.

APPENDIX 1C

A semiconductor device comprising:
a semiconductor element including a bottom surface;
a lead including an island portion on which the semiconductor element is mounted; and
a bonding material that bonds the bottom surface and the island portion to each other after being in a molten state,
the bottom surface of the semiconductor element has a higher wettability to the bonding material in a molten state than that of the island portion.

APPENDIX 2C

The semiconductor device according to Appendix 1C, wherein the semiconductor element includes a bottom-surface electrode that provides the bottom surface.

APPENDIX 3C

The semiconductor device according to Appendix 2C, wherein the bottom-surface electrode is formed on an entire surface of the semiconductor element on the bottom surface side.

APPENDIX 4C

The semiconductor device according to Appendix 2C or 3C, wherein the bonding material is electrically conductive.

APPENDIX 5C

The semiconductor device according to Appendix 4C, wherein the bonding material is solder.

APPENDIX 6C

The semiconductor device according to Appendix 5C, wherein the bottom-surface electrode is made of Au or Ag.

APPENDIX 7C

The semiconductor device according to Appendix 6C, wherein the island portions is made of Cu.

APPENDIX 8C

The semiconductor device according to any one of Appendixes 1C-7C, wherein the island portion includes a trench positioned on an outer side of the semiconductor element.

APPENDIX 9C

The semiconductor device according to Appendix 8C, wherein the bonding material is positioned inward of the trench.

APPENDIX 10C

The semiconductor device according to Appendix 9C, wherein the trench surrounds an entire periphery of the semiconductor element.

APPENDIX 11C

The semiconductor device according to any one of Appendixes 1C-10C, further comprising a sealing resin covering the semiconductor element and the island portion, wherein the island portion is formed with a plurality of recesses.

APPENDIX 12C

The semiconductor device according to Appendix 11C, wherein the island portion has a smooth surface at a portion that overlaps the semiconductor element.

APPENDIX 13C

The semiconductor device according to Appendix 11C or 12C, wherein each of the recesses is circular in cross section.

APPENDIX 14C

The semiconductor device according to one of Appendixes 11C-13C, wherein the recesses are arranged so as to surround the semiconductor element.

APPENDIX 15C

The semiconductor device according to any one of Appendixes 11C-14C, wherein the recesses are arranged in a matrix.

APPENDIX 16C

The semiconductor device according to Appendix 15C, wherein the recess are arranged at equal intervals.

APPENDIX 17C

The semiconductor device according to any one of Appendixes 11C-16C, wherein the lead includes a pad portion on which the semiconductor element is mounted and a wire is connected, and the pad portion is formed with a plurality of recesses.

APPENDIX 18C

The semiconductor device according to any one of Appendixes 11C-17C, wherein the lead includes a terminal portion connected to the island portion and exposed from the sealing resin, and
the island portion includes a corner where two discontinuous sides are connected to each other and an arcuate portion that is positioned closer to the terminal portion than the corner is.

APPENDIX 19C

The semiconductor device according to Appendix 18C, wherein the corner is farther away from the terminal portion than the semiconductor element is, and
the arcuate portion is closer to the terminal portion than the semiconductor element is.

APPENDIX 20C

The semiconductor device according to Appendix 18C or 19C, wherein the sealing resin includes a subsequent portion which is provided at a position closer to the corner than to the arcuate portion of the island portion and which reaches an obverse surface of the sealing resin.

APPENDIX 1D

A semiconductor device comprising:
a semiconductor element;
a lead including an island portion on which the semiconductor element is mounted; and
a sealing resin covering the semiconductor element and the island portion,
wherein the island portion is formed with a plurality of recesses.

APPENDIX 2D

The semiconductor device according to Appendix 1D, wherein the island portion has a smooth surface at a portion that overlaps the semiconductor element.

APPENDIX 3D

The semiconductor device according to Appendix 1D or 2D, wherein each of the recesses is circular in cross section.

APPENDIX 4D

The semiconductor device according to any one of Appendixes 1D-3D, wherein the recesses are arranged so as to surround the semiconductor element.

APPENDIX 5D

The semiconductor device according to any one of Appendixes 1D-4D, wherein the recesses are arranged in a matrix.

APPENDIX 6D

The semiconductor device according to Appendix 5D, wherein the recess are arranged at equal intervals.

APPENDIX 7D

The semiconductor device according to any one of Appendixes 1D-6D, wherein the lead includes a pad portion on which the semiconductor element is not mounted and a wire is connected, and the pad portion is formed with a plurality of recesses.

APPENDIX 8D

The semiconductor device according to any one of Appendixes 1D-7D, wherein the lead includes a terminal portion connected to the island portion and exposed from the sealing resin, and the island portion includes a corner where two discontinuous sides are connected to each other and an arcuate portion that is positioned closer to the terminal portion than the corner is.

APPENDIX 9D

The semiconductor device according to Appendix 8D, wherein the corner is farther away from the terminal portion than the semiconductor element is, and the arcuate portion is closer to the terminal portion than the semiconductor element is.

APPENDIX 10D

The semiconductor device according to Appendix 8D or 9D, wherein the sealing resin includes a subsequent portion which is provided at a position closer to the corner than to the arcuate portion of the island portion and which reaches an obverse surface of the sealing resin.

APPENDIX 11D

The semiconductor device according to any one of Appendixes 1D-10D, wherein:

the semiconductor element has a bottom surface, the semiconductor device further comprises a bonding material that bonds the bottom surface and the island portion to each other after being in a molten state, and the bottom surface of the semiconductor element has a higher wettability to the bonding material in a molten state than that of the island portion.

APPENDIX 12D

The semiconductor device according to Appendix 11D, wherein the semiconductor element includes a bottom-surface electrode that provides the bottom surface.

APPENDIX 13D

The semiconductor device according to Appendix 12D, wherein the bottom-surface electrode is formed on an entire surface of the semiconductor element on the bottom surface side.

APPENDIX 14D

The semiconductor device according to Appendix 12D or 13D, wherein the bonding material is electrically conductive.

APPENDIX 15D

The semiconductor device according to Appendix 14D, wherein the bonding material is solder.

APPENDIX 16D

The semiconductor device according to Appendix 15D, wherein the bottom-surface electrode is made of Au or Ag.

APPENDIX 17D

The semiconductor device according to Appendix 16D, wherein the island portions is made of Cu.

APPENDIX 18D

The semiconductor device according to any one of Appendixes 11D-17D, wherein the island portion includes a trench positioned on an outer side of the semiconductor element.

APPENDIX 19D

The semiconductor device according to Appendix 18D, wherein the bonding material is positioned inward of the trench.

APPENDIX 20D

The semiconductor device according to Appendix 19D, wherein the trench surrounds an entire periphery of the semiconductor element.

The invention claimed is:

1. A semiconductor device comprising:
    a first semiconductor element;
    a lead including a first island portion on which the semiconductor element is mounted;
    a heat dissipation member made of a ceramic material for dissipating heat from the island portion; and
    a sealing resin covering the semiconductor element, the island portion and a part of the heat dissipation member, wherein the heat dissipation member includes an exposed surface and a side surface connected to the exposed surface, the exposed surface being exposed from the sealing resin and the side surface being at least partially covered by the sealing resin, and the side surface includes a smooth portion and a rough portion positioned farther away from the exposed surface than the smooth portion is the smooth portion being smoother than the rough portion.

2. The semiconductor device according to claim 1, wherein the side surface is provided along an entire periphery of the heat dissipation member.

3. The semiconductor device according to claim 1, wherein an entirety of the side surface is covered by the sealing resin.

4. The semiconductor device according to claim 1, wherein the exposed surface is flush with a surface of the sealing resin.

5. The semiconductor device according to claim 1, wherein the rough portion is positioned inward of the smooth portion as viewed in plan.

6. The semiconductor device according to claim 1, wherein the smooth portion is perpendicular to the exposed surface.

7. The semiconductor device according to claim 1, wherein the rough portion is inclined so as to shift inward as viewed in plan with increasing distance from the exposed surface.

8. The semiconductor device according to claim 1, wherein the side surface comprises a plurality of linear portions as viewed in plan.

9. The semiconductor device according to claim 8, wherein the heat dissipation member is rectangular.

10. The semiconductor device according to claim 1, wherein a boundary between the smooth portion and the rough portion is parallel to the exposed surface.

11. The semiconductor device according to claim 1, further comprising a second semiconductor element and a bonding layer, wherein the lead includes a second island portion on which the second semiconductor element is mounted, the bonding layer bonds the first and the second island portions to the heat dissipation member, and the bonding layer includes a first and a second individual regions provided for the first and the second island portions, respectively, the first individual region and the second individual region being spaced apart from each other.

12. The semiconductor device according to claim 11, wherein the first individual region has an outer edge positioned inward of an outer edge of the first island portion as viewed in plan, and the second individual region has an outer edge positioned inward of an outer edge of the second island portion as viewed in plan.

13. The semiconductor device according to claim 11, wherein the heat dissipation member is in a form of a plate.

14. The semiconductor device according to claim 11, wherein each of the first and the second semiconductor elements is a power semiconductor element.

15. The semiconductor device according to claim 1, further comprising a bonding layer and a plurality of semiconductor elements including the first semiconductor element, wherein the lead comprises a plurality of island portions including the first island portion, the bonding layer bonds the plurality of island portions to the heat dissipation member, and the bonding layer includes a plurality of individual regions equal in number to the plurality of island portions.

16. The semiconductor device according to claim 15, wherein at least two of the plurality of semiconductor elements are mounted on one of the plurality of island portions.

17. The semiconductor device according to claim 15, wherein the plurality of island portions are aligned along a common direction.

18. The semiconductor device according to claim 15, wherein the lead includes a plurality of terminal portions that are connected to the plurality of island portions and exposed from the sealing resin.

19. The semiconductor device according to claim 1, wherein the island portion is formed with a plurality of recesses.

20. The semiconductor device according to claim 19, wherein the plurality of recesses are arranged to surround the semiconductor element.

* * * * *